United States Patent
Reedy et al.

(10) Patent No.: US 6,583,445 B1
(45) Date of Patent: Jun. 24, 2003

(54) INTEGRATED ELECTRONIC-OPTOELECTRONIC DEVICES AND METHOD OF MAKING THE SAME

(75) Inventors: Ronald E. Reedy, San Diego, CA (US); Ravindra A. Athale, Burke, VA (US); George J. Simonis, Silver Spring, MD (US); Andreas G. Andreou, Baltimore, MD (US); Alyssa Apsel, Baltimore, MD (US); Zaven Kalayjian, Baltimore, MD (US); Philippe O. Pouliquen, Baltimore, MD (US)

(73) Assignees: Peregrine Semiconductor Corporation, San Diego, CA (US); George Mason University, Fairfax, VA (US); John Hopkins University, Baltimore, MD (US); The United States of America as represented by the Secretary of the Army, Washington, DC (US)

( * ) Notice: Subject to any disclaimer, the term of this patent is extended or adjusted under 35 U.S.C. 154(b) by 29 days.

(21) Appl. No.: 09/658,259

(22) Filed: Sep. 8, 2000

Related U.S. Application Data

(60) Provisional application No. 60/211,908, filed on Jun. 16, 2000.

(51) Int. Cl.$^7$ .............................................. H01L 27/15
(52) U.S. Cl. ............................. 257/82; 257/80; 257/81; 372/50
(58) Field of Search ............................ 372/50; 257/80, 257/81, 82

(56) References Cited

U.S. PATENT DOCUMENTS

| | | |
|---|---|---|
| 4,122,479 A | 10/1978 | Sugawara et al. ............. 357/19 |
| 4,843,448 A | 6/1989 | Garcia et al. |
| 5,027,171 A | 6/1991 | Reedy et al. |
| 5,416,043 A | 5/1995 | Burgener et al. |
| 5,492,857 A | 2/1996 | Reedy et al. |
| 5,572,040 A | 11/1996 | Reedy et al. |
| 5,596,205 A | 1/1997 | Reedy et al. |
| 5,600,169 A | 2/1997 | Burgener et al. |
| 5,605,856 A | 2/1997 | Goosen et al. |
| 5,663,570 A | 9/1997 | Reedy et al. |
| 5,858,814 A | 1/1999 | Goossen et al. |
| 5,861,336 A | 1/1999 | Reedy et al. |
| 5,863,823 A | 1/1999 | Burgener |
| 5,883,396 A | 3/1999 | Reedy et al. |
| 5,895,957 A | 4/1999 | Reedy et al. |
| 5,920,233 A | 7/1999 | Denny |
| 5,923,951 A | 7/1999 | Goossen et al. |
| 5,930,638 A | 7/1999 | Reedy et al. |
| 5,973,363 A | 10/1999 | Staab et al. |
| 5,973,382 A | 10/1999 | Burgener et al. |
| 6,005,262 A | 12/1999 | Cunningham et al. |
| 6,034,431 A | 3/2000 | Goosen et al. |
| 6,057,555 A | 5/2000 | Reedy et al. |
| 6,243,508 B1 * | 6/2001 | Jewell et al. ................. 385/14 |

OTHER PUBLICATIONS

Lin, Chao–Kun, Student Member, IEEE, Ryu, Sang–Wan, Dapkus, P. Daniel 1999. High Performance Wafer–Gonded Bottom–Emitting 850–nm VCSEL's on Undoped GaP and Sapphire Substrates. IEEE Photonics Technology Letters vol. 11, No. 12, pp. 1542–1544.

(List continued on next page.)

*Primary Examiner*—Douglas A. Wille
(74) *Attorney, Agent, or Firm*—Steven J. Hultquist; Janet R. Elliott; Yongzhi Yang

(57) ABSTRACT

An integrated electronic-optoelectronic module comprising: an ultrathin silicon-on-sapphire composite substrate; at least one electronic device fabricated in the ultrathin silicon; and at least one optoelectronic device bonded to the ultrathin silicon-on-sapphire composite substrate and in electrical communication with the at least one electronic device fabricated in the ultrathin silicon layer. For example, VCSELs and photodetectors are integrated with CMOS electronic circuitry to provide useful modules for electro-optical interconnects for computing and switching systems.

26 Claims, 10 Drawing Sheets

OTHER PUBLICATIONS

Simonis, et al., "Research on VCSEL interconnects and OE processing at Army Research Laboratory", *Proc. SPIE*, 3946, paper #28, SPIE Photonics West, San Jose, CA, Jan. 22–28, 2000.

Yoo, et al., "Experimental Demonstration of a Multihop Shuffle Network Using WDM Multiple–Plane Optical Interconnection with VCSEL and MQW/DBR Detector Arrays", *IEEE Photonics Technology Letters*, vol. 10, No. 10, Oct. 1998, pp. 1507–1509.

Lin, et al., "High–Performance Wafer–Bonded Bottom–Emitting 850–nm VCSEL's on Undoped GaP and Sapphire Substrates", *IEEE Photonics Technology Letters*, vol. 11, No. 12, Dec. 1999, pp. 1542–1544.

Louerback, et al., "Flip–Chip Bonded Arrays of Monolithically Integrated, Microlensed Vertical–Cavity Lasers and Resonant Photodetectors", *IEEE Photonics Technology Letters*, vol. 11, No. 3, Mar. 1999, pp. 304–306.

Louderback, et al., "Modulation and Free–Space Link Characteristics of Monolithically Integrated Vertical–Cavity Lasers and Photodetectors with Microlenses", *IEEE Journal of Selected Topics in Quantum Electronics*, vol. 5, No. 2, Mar./Apr. 1999, pp. 157–165.

Chen, et al., "Collimating Diode Laser Beams from a Large–Area VCSEL–Array Using Microlens Array", *IEEE Photonics Technology letters*, vol. 11, No. 5, May 1999, pp. 506–508.

Hu, et al., "Multimode WDM Optical Data Links with Monolithically Integrated Multiple–Channel VCSEL and Photodetector Arrays", *IEEE Journal of Quantum Electronics*, vol. 34, No. 8, Aug. 1998, pp. 1403–1414.

Ahadian, et al., "Practical OEIC's Based on the Monolithic Integration of GaAs–InGaP LED's with Commerical GaAs VLSI Electronics", *IEEE Journal of Quantum Electronics*, vol. 34, No. 7, Jul. 1998, pp. 1117–1123.

London, et al., "Preparation of Silicon–on–Gallium Arsenide Wafers for Monolithic Optoelctronic Integration", *IEEE Photonics Technology Letters*, vol. 11, No. 8, Aug. 1999, pp. 958–960.

R.E. Reedy et al., "Characterization of Defect Reduction and Aluminum Redistribution in Silicon Implanted SOS Films", Journal Of Crystal Growth, vol. 58, No. 1, pp 53–60, Jun. 1982.

R.E. Reedy et al., "Suppressing Al Outdiffusion in Implantation Amorphized and Recrystallized Silicon on Sapphire Films", Applied Physics Letters. vol. 42, No. 8, pp 707–709, Apr., 1983.

G.A. Garcia et al., "High–Quality CMOS on Thin (100 nm) Silicon on Sapphire", IEEE Electron Device Letters, vol. 9, No. 1, pp 32–34, Jan. 1988.

R.E. Reedy et al., "Thin (100 nm) SOS for Application to Beyond VLSI Microelectronics", Mat. Res. Soc. Symp. Proc., vol. 107, pp 365–376, 1988.

E.M. Strzelecka, et al., "VCSEL based modules for optical interconnects", *SPIE Proceedings*, vol. 3627, SPIE Conference on Vertical–Cavity Surface–Emitting Lasers III, San Jose, CA, Jan. 23–29, 1999, pp 2–13.

* cited by examiner

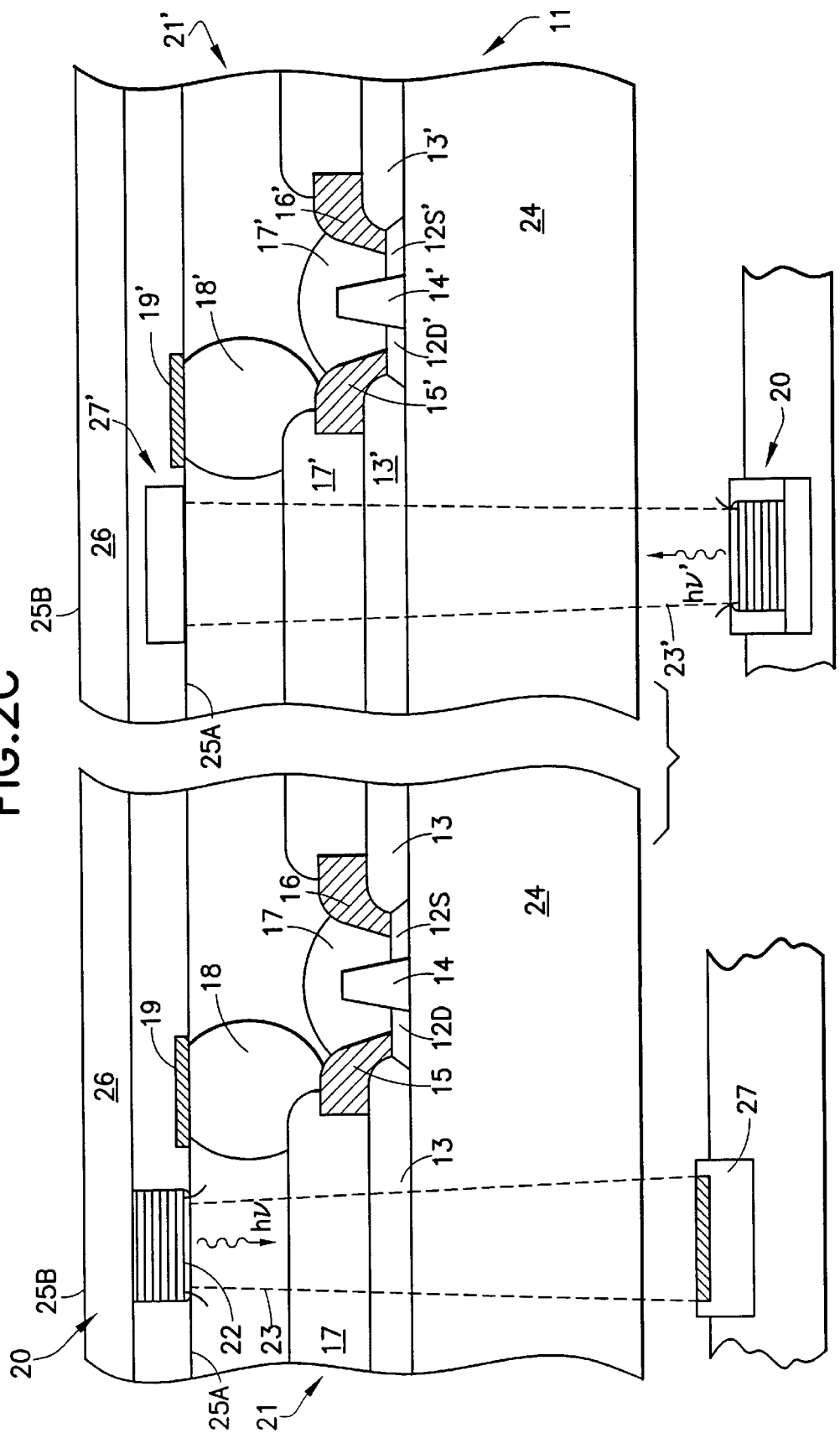

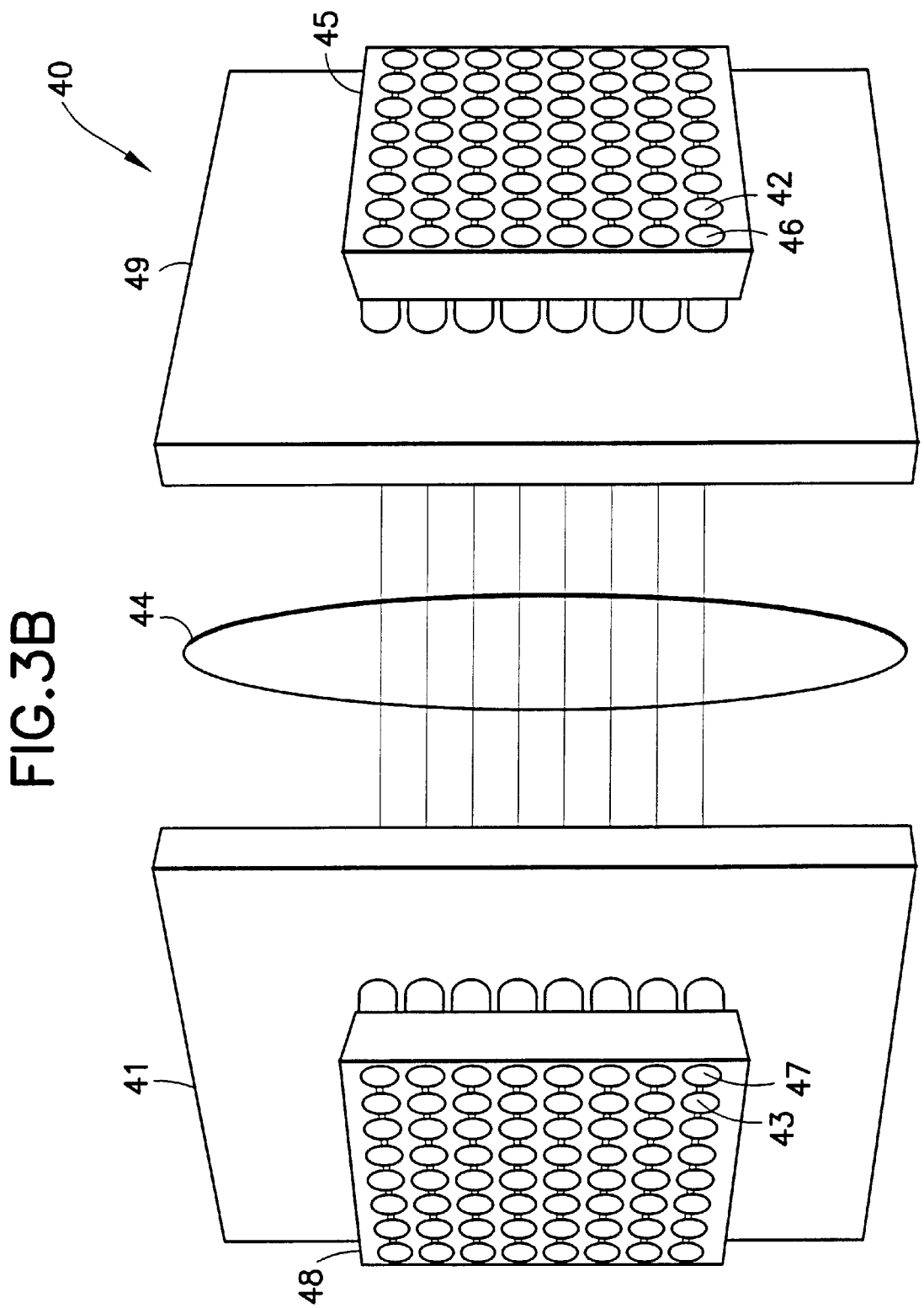

INTEGRATED ELECTRONIC-OPTOELECTRONIC DEVICES AND METHOD OF MAKING THE SAME

RELATED APPLICATION

This patent application claims the benefit of U.S. Provisional Application Serial No. 60/211,908, which was originally filed on Jun. 16, 2000.

GOVERNMENT INTEREST

This invention was made with U.S. Government support under Contract Numbers Job Order 9NOVNI Doc. IPAALCSEDDO2 awarded by the United States Army Research Laboratory. The U.S. Government has certain rights in the invention.

FIELD OF THE INVENTION

The present invention generally relates to hybrid semiconductor assemblies that incorporate at least two dissimilar semiconductor devices. More specifically, the present invention relates to hybrid semiconductor modules incorporating at least one optoelectronic device and at least one electronic circuit (e.g. CMOS), methods for making the hybrid modules, and optoelectronic switching and interconnect assemblies incorporating the hybrid modules.

BACKGROUND OF THE INVENTION

Electronic circuits fabricated in silicon form the foundation of modern technology for communication and computing. Technologies for building optoelectronic devices such as semiconductor lasers and detectors as well as electrooptic modulators have advanced to a point where such devices are becoming major components of high performance communication and computing systems. It would be desirable to combine both the silicon electronic and the optoelectronic/electrooptic devices in a single unit in order to lower the cost as well as reduce the power and speed penalty incurred when these two devices are deployed in separately packaged units.

The vertical cavity surface-emitting laser (VCSEL) is an example of an optoelectronic device desirably integrated with CMOS circuitry. The VCSEL has emerged as a new light source alongside the conventional edge-emitting semiconductor laser. Advantages of the VCSEL include its compactness, inherent single-longitudinal mode operation, circular beam profile, low current threshold (as low as 20 $\mu A$), low power dissipation, and potential for integration with other electronic circuitry. Vertical-cavity lasers hold promise of superior performance in many optoelectronic applications and lower manufacturing cost than edge-emitting lasers. VCSELs are excellent light sources for optical data links. VCSELs are processed and tested at the wafer level, and one-dimensional or two dimensional arrays suitable for coupling to fiber optic ribbons or matrices are readily fabricated. Light is emitted perpendicular to the substrate with a circular beam that enables efficient, direct fiber or waveguide coupling. Particularly desirable are VCSELs emitting light of wavelength approximately 850-nm. Such VCSELs may be fabricated in high yield and are commercially available (e.g., Emcore Corp. MODE Division, Albuquerque, N.Mex.).

Furthermore, two-dimensional arrays of VCSELs can be imaged in free space using lenses or transmitted in two dimensional bundles of fibers (image guide) in order to implement optical interconnects, for example, highly parallel (thousands of channels) optical data links. Such applications have been analyzed theoretically (e.g., Louderback, et al., "Modulation and Free-Space Link Characteristics of Monolithically Integrated Vertical-Cavity Lasers and Photodetectors with Microlenses", *IEEE Journal of Selected Topics in Quantum Electronics*, Vol. 5, No. 2, March/April 1999, pp. 157–165; Simonis, et al., "Research on VCSEL interconnects and OE processing at Army Research Laboratory", *Proc. SPIE*, 3946, paper #28, SPIE Photonics West, San Jose, Calif., Jan. 22–28, 2000).

Metal-oxide semiconductor (MOS) technology is virtually the standard for digital circuits that are used for computers and telecommunications. Increasingly, CMOS (complementary MOS) technology is utilized in these applications. CMOS technology incorporates both n-channel MOS and p-channel MOS transistors in the same monolithic structure. No other approach can compare with the high device densities and high yields available with silicon CMOS technology.

High-density CMOS electronic circuits are typically made in silicon, while high performance optoelectronic devices are typically made in various optically active materials, such as compound semiconductors, most commonly III–V materials, especially GaAs, as well as II–VI semiconductors such as ZnSe, transparent ferroelectrics such as lithium niobate and other related oxide materials, and liquid crystal and other optoelectronic polymers.

Optoelectronic devices may be fabricated in epitaxial layers grown on suitable substrates which are not ordinarily silicon. For example, VCSELs are typically fabricated in AlGaAs and GaAs on GaAs substrates. Optoelectronic devices may also be fabricated in single crystal materials such as oxides.

Thus, it is necessary to find methods to combine the high density, high speed CMOS devices (typically made in silicon) with the optoelectronic devices (typically made in III–V materials) in an intimate fashion in order to minimize parasitic capacitance and inductance and to increase density of optical interconnects. Applications for such a capability include chip-to-chip communication through formation of transmitter, receiver and/or amplifier modules for optical fiber communication.

One approach to integrate Si and III–V materials is heteroepitaxial growth, that is the crystalline growth of one material on a dissimilar crystal substrate. Heteroepitaxial growth of GaAs on silicon, and silicon on GaAs have been explored. After decades of research, fundamental problems such as the mismatch in the crystal lattice constants and the difference in the coefficients of thermal expansion of the two materials have prevented this goal from being satisfactorily achieved. The limitations are particularly acute when high performance lasers, photodetectors or drive electronics are required.

Another approach is called epoxy casting, by which completely fabricated chips are mounted in a common epoxy cast and final metal deposited. This is a form of manufacturing commonly called multi-chip modules, or MCMs. This approach also has numerous problems, including high cost and poor parasitics, size, reliability and yield.

More recently, several approaches have been investigated that are based on a technique of flip-chip bonding. In this technique, a chip is flipped over and attached to a substrate or other chip by a solder joint. Hence, two dissimilar chips are brought into intimate electrical and mechanical contact with each other. For example, the flip-chip bonding technique has been used for combining low temperature long-wavelength infrared (IR) detector arrays with silicon readout circuitry. There are commercial machines that can perform this flip-chip bonding operation with great reliability and repeatability. For long-wavelength infrared (IR) detector arrays, the detector array substrate may be transparent to the infrared wavelengths being detected by the IR detector array, thus facilitating the optical coupling to a flip-chip mounted IR detector. However, for optical wavelengths less than approximately 1 µm, the detector substrate is often too opaque for use as a transparent substrate, so this technique cannot be used and hence the substrate needs to be removed for optical access to the OE devices.

Individual steps typically involved in heterogeneous bonding of OE devices may include the following:

1. Process the appropriate wafers to build electronic and optoelectronic devices;
2. Test, then separate out functional devices;
3. Interconnect electronic and optoelectronic devices by wire bonding, solder, flip-chip bonding, wafer bonding, etc.; and
4. Remove any substrates necessary to provide optical access to the optoelectronic device.

The order in which these operations are performed is often varied; and there are multiple variations on how to accomplish each step or series of steps. In one variation, the optoelectronics circuits are separated from their GaAs substrate as a very thin layer, then applied to a new substrate as a decal. This technique is very expensive and has numerous limitations on speed and design.

In a second variation, two wafers are bonded together and the backside of one of the wafers is removed by grinding and etching. Thickness control of the silicon film is difficult, and the cost is high. This technique is not suitable for attachment of a Si wafer to GaAs wafer due to the brittleness of GaAs.

In yet another variation, known good die of electronics and OE devices can each be assembled by flip-chip attaching them to a common transparent substrate on which interconnect wiring has been defined. This technique has the advantage that an ideal optical substrate such as sapphire can be used to combine electronics with optical components and permit the light to emit through the substrate. However, the silicon electronics exhibits high internal parasitic capacitance and crosstalk and the assembly becomes an expensive form of a multi-chip module, with all the limitations and costs of that approach. Furthermore, the interconnect wiring on the transparent substrate has significant amounts of parasitic capacitance and inductance which cause a loss of performance.

The opacity of the substrate material (GaAs or Si) to the optical radiation at the often-preferred wavelengths of 850-nm and less presents a significant obstacle to easy hybrid integration of electronic (CMOS) and optoelectronic devices. An additional major issue is that the electronics and optoelectronic devices generate heat, which must be removed to maintain all device performance and reliability characteristics. Also, GaAs is a very brittle material and the devices are sensitive to stress.

U.S. Pat. No. 5,858,814 ("Hybrid Chip and Method Therefor") discloses a method for co-locating on a common semiconductor substrate two or more different types of GaAs-based or InP-based optoelectronic components, such as a p-i-n diode and a surface-emitting laser, or a quantum well modulator. The common substrate is a silicon wafer which includes electronic circuitry to control the optoelectronic elements. The optoelectronic components have different epitaxial structures and may be grown on different substrates, e.g., GaAs or InP. Due to the opacity of the silicon and III–V substrates, the optoelectronic devices must each be fabricated with an etch-stop stop layer, and after each is bonded to the common silicon substrate, its original III–V substrate is etched away, in order to provide optical access to the device.

U.S. Pat. No. 5,923,951 ("Method of Making a Flip-Chip Bonded GaAs-Based Opto-Electronic Device") describes GaAs-based optoelectronic devices flip-chip bonded to a silicon substrate bearing microelectronic circuitry for controlling the optoelectronic elements. A method to facilitate removal of the GaAs substrate in order to provide optical access to the optoelectronic elements using etch stop layers and selective etching is disclosed.

U.S. Pat. No. 6,005,262 ("Flip-Chip Bonded VCSEL CMOS Circuit with Silicon Monitor Detector") describes a hybrid chip wherein the VCSEL is provided with a blocking layer, e.g., aluminum to prevent rearwardly emitted photons from the VCSEL for interfering CMOS operation. The VCSEL is configured to emit light from a first surface of the device, but a problem arises in that a significant amount of light is also emitted in the anti-parallel direction, through a second surface of the device into the substrate. The light emitted through the second surface of the VCSEL may be absorbed by the silicon CMOS circuitry, degrading its performance. The blocking layer addresses that problem. In another embodiment, the blocking layer is removed and a photon detector is formed in the CMOS for collecting the rearwardly emitted photons for use in determining, inter alia, VCSEL power.

Lin, et al., ("High-Performance Wafer-Bonded Bottom-Emitting 850-nm VCSEL's on Undoped GaP and Sapphire Substrates", *IEEE Photonics Technology Letters*, Vol. 11, No. 12, December 1999, pp. 1542–1544) describe a GaAs VCSEL bonded to a sapphire substrate to provide a high-efficiency 850-nm bottom-emitting VCSEL. Flip-chip bonding of the bottom-emitting VCSEL with silicon circuitry provides hybrid integration of the VCSEL with the silicon circuitry. The 850-nm wavelength light from the bottom-emitting VCSEL passes through the sapphire substrate, not through the silicon circuitry or its substrate.

Louderback, et al. ("Flip-Chip Bonded Arrays of Monolithically Integrated, Microlensed Vertical-Cavity Lasers and Resonant Photodetectors", *IEEE Photonics Technology Letters*, Vol. 11, No. 3, March 1999, pp. 304–306) describe 980-nm bottom-emitting VCSELs bonded to semi-insulating GaAs substrates. At this wavelength, the GaAs is reasonably transparent to the VCSEL emission. However, the CMOS circuitry is on another substrate, presumably silicon, which is bonded to the VCSEL assembly. In this structure, light is transmitted through the GaAs substrate and does not pass through the CMOS circuitry substrate.

There is, therefore, a need for an improved commercially-viable method for assembling such differently configured optoelectronic and electronic devices such that hybrid chips incorporating such devices can be produced with minimal sacrifice in the performance of the devices.

SUMMARY OF THE INVENTION

The present invention describes devices (and methods for making such devices) which combine electronic and optoelectronic devices into a single integrated module that overcomes many of the disadvantages and shortcomings of previously described devices and methods. Furthermore, the present invention describes techniques which are readily manufacturable and that do not sacrifice the speed and power performance of either of the individual electronic or optoelectronic device components. The present invention includes a hybrid module and method for making the hybrid module which combines electronic devices (e.g. silicon CMOS devices and circuitry) with optoelectronic devices (e.g. GaAs lasers, detectors, etc.) in a manner which enables radio frequency electronic circuits, analog electronic circuits, digital electronic circuits, and optoelectronic devices to operate at high frequency without interfering with each other.

The present invention addresses some of the specific challenges and shortcomings previously described by using transparent, insulating substrate materials for integration of optoelectronic and electronic capabilities. Of such transparent, insulating materials, oxides such as sapphire and spinel are particularly desirable substrate materials for integrated electronic-optoelectronic modules. For example, sapphire is transparent to a very wide range of optical wavelengths and possesses excellent optical homogeneity; its coefficient of thermal expansion closely matches that of the GaAs used for many optoelectronic devices; and it is an excellent electrical insulator and thermal conductor.

Integration of silicon electronic devices/circuits with optoelectronic devices on a common insulating transparent substrate requires that an effective method for forming the silicon electronic devices/circuits on the transparent, insulating substrate be used. The present invention provides a method and structure for meeting this requirement in the form of a unique composite substrate comprising a monocrystalline semiconductor layer, such as silicon, epitaxially deposited on a supporting insulating substrate, such as sapphire. The advantages of using this type of composite substrate include the substantial reduction of parasitic capacitance between charged active regions in the silicon and the substrate and the effective elimination of leakage currents flowing between adjacent active devices. This is accomplished by employing as the substrate an insulating material, such as sapphire ($Al_2O_3$), spinel, or other known highly insulating materials, and providing that the conduction path of any interdevice leakage current must be through the insulating substrate.

An "ideal" silicon-on-sapphire composite substrate may be defined to include a completely monocrystalline, defect-free silicon layer of sufficient thickness to accommodate the fabrication of active devices therein. In this "ideal" silicon-on-sapphire composite substrate, the silicon layer is adjacent to a sapphire substrate and has a minimum of crystal lattice discontinuities at the silicon-sapphire interface. Early attempts to fabricate this "ideal" silicon-on-sapphire composite substrate were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or regrowth schemes.

It has been found that silicon on sapphire composite wafers/substrates having high quality silicon films suitable for demanding device applications can be fabricated on sapphire substrates by a method that involves: epitaxial deposition of a silicon layer on a sapphire substrate; implanting a given ion species into the silicon layer to form a buried amorphous region in the silicon layer which extends substantially from the surface of the sapphire substrate into the silicon layer, thus leaving a surface layer of monocrystalline silicon covering the buried amorphous region; and annealing the silicon on sapphire composite wafer to induce solid phase epitaxial regrowth of the buried amorphous region using the surface layer of monocrystalline silicon as a crystallization seed. The high quality of the silicon layer is preserved during device fabrication in the silicon layer by performing any processing which subjects the silicon layer to temperatures in excess of approximately 950° C. in an oxidizing ambient environment, and performing any processing which subjects the silicon layer to temperatures which are less than approximately 950° C. in either one of an oxidizing ambient environment or a non-oxidizing ambient environment.

Examples of devices and methods for making silicon-on-sapphire composite wafers/substrates and devices thereon are described in U.S. Pat. Nos. 5,416,043 ("Minimum Charge FET Fabricated on an Ultrathin Silicon on Sapphire Wafer"); 5,492,857 ("High-Frequency Wireless Communication System on a Single Ultrathin Silicon on Sapphire Chip"); 5,572,040 ("High-Frequency Wireless Communication System on a Single Ultrathin Silicon on Sapphire Chip"); 5,596,205 ("High-Frequency Wireless Communication System on a Single Ultrathin Silicon on Sapphire Chip"); 5,600,169 ("Minimum Charge FET Fabricated on an Ultrathin Silicon on Sapphire Wafer"); 5,663,570 ("High-Frequency Wireless Communication System on a Single Ultrathin Silicon on Sapphire Chip"); 5,861,336 ("High-Frequency Wireless Communication System on a Single Ultrathin Silicon on Sapphire Chip"); 5,863,823 ("Self-Aligned Edge Control in Silicon on Insulator"); 5,883,396 ("High-Frequency Wireless Communication System on a Single Ultrathin Silicon on Sapphire Chip"); 5,895,957 ("Minimum Charge FET Fabricated on an Ultrathin Silicon on Sapphire Wafer"); 5,920,233 ("Phase Locked Loop Including a Sampling Circuit for Reducing Spurious Side Bands"); 5,930,638 ("Method of Making a Low Parasitic Resistor on Ultrathin Silicon on Insulator"); 5,973,363 ("CMOS Circuitry with Shortened P-channel Length on Ultrathin Silicon on Insulator"); 5,973,382 ("Capacitor on Ultrathin Semiconductor on Insulator"); and 6,057,555 ("High-Frequency Wireless Communication System on a Single Ultrathin Silicon on Sapphire Chip"). The entirety of each of the above mentioned patents is hereby incorporated herein by reference. Additionally, all other patents, patent applications and other publications mentioned in this specification are hereby incorporated herein by reference in their entirety.

By the methods described in the patents listed above, electronic devices can be formed in an extremely thin layer of silicon on an insulating sapphire substrate. The thickness of the silicon layer is typically less than approximately 150-nm. This "ultrathin" silicon layer maximizes the advantages of the insulating sapphire substrate and allows for the integration of multiple functions on a single chip. Traditional transistor isolation wells required when using traditional thick silicon structures and techniques are unnecessary, simplifying transistor processing and increasing device/circuit densities. These improved thin silicon on insulator methods and devices will be distinguished herein from earlier thick-silicon embodiments by referring to them collectively as "ultrathin silicon-on-sapphire."

Many types of circuitry, including CMOS circuits, have been fabricated in this ultrathin silicon-on-sapphire prepared by the methods referred to above. CMOS circuitry fabricated in ultrathin silicon-on-sapphire composite substrates exhibit very high speed and low power characteristics. While the ultrathin silicon-on-sapphire composite substrates have the advantage that well-known silicon circuit design and technology can be used to fabricate many devices in the thin silicon layer, further advantageous circuit designs are also possible that are uniquely enabled by the distinctive electrical and materials properties of the thin silicon layer on the sapphire substrate. For example, the present invention makes it possible for these well-known and further advantageous silicon circuits (fabricated in the ultrathin silicon-on-sapphire composite structure) to serve as the substrate/foundation upon which optoelectronic devices can be attached, thereby creating an integrated hybrid electronic-optoelectronic module. Optoelectronic devices which benefit by being integrated with silicon electronic circuitry (e.g. CMOS) based in composite substrates, such as the ultrathin silicon-on-sapphire, include all such devices that manipulate light, including but not limited to light-emitting diodes, lasers, photodetectors and modulators.

The devices and methods of the present invention utilize this ultrathin silicon-on-sapphire composite substrate to successfully integrate electronic devices (e.g. silicon CMOS devices and circuitry) with optoelectronic devices (e.g. GaAs lasers, detectors, etc.) into a hybrid module.

Applications of the present invention include electronic-optoelectronic modules and devices and methods for fabricating such modules and devices. In a first example, a first wafer having electronic circuits/devices thereon is wafer-level flip-chip bonded to a second wafer having optoelectronic devices thereon. The first wafer is an ultrathin silicon-on-sapphire composite substrate wafer which includes: 1) electronic devices; 2) optically transparent areas; and 3) bonding pads. The second wafer is a suitable substrate bearing the optoelectronic devices and bonding pads such that the bonding pads on the first and second wafers align appropriately. The wafer-level bonding is followed by dicing of the flip-chip bonded structure to yield hybrid integrated devices, each of which incorporates at least one optoelectronic device and at least one electronic circuit in electrical communication therewith.

In a second example, the present invention provides hybrid chips that can be used to form an improved optical interconnection system. Such an optical interconnection system includes an array of optical input waveguides for delivering a plurality of optical input signals to an array of input optoelectronic devices (detectors) on the hybrid chip. Logic circuitry on the chip processes electrical signals generated by the input optoelectronic devices and controls the output optoelectronic devices. The output optoelectronic devices generate a plurality of optical output signals which are delivered to an array of output waveguides.

In a third example, the present invention provides hybrid chips that can be used to form an improved optical interconnection system based on one-dimensional or two-dimensional arrays of optical beams propagating in free space or two-dimensional arrays of optical fiber interconnects.

In these examples, the electronic circuits in silicon may include CMOS devices. Typical CMOS devices include VCSEL drivers, receiver circuits for photodetectors, and other signal/data processing and switching circuits. Typical optoelectronic devices may include light-emitting devices such as lasers and diodes, light detecting devices such as photodetectors, and light modulators, such as quantum well modulators. Often, the light emitting optoelectronic devices are fabricated in III–V materials; and the light detecting devices are fabricated in III–V, IV and II–VI materials. For infrared and visible light, the light emitting devices are commonly on GaAs substrates and light detecting devices are fabricated in GaAs, InGaAs, Si, Ge. In the practice of the present invention, it is an advantage that optoelectronic devices of more than one type of material may be incorporated into the hybrid module. For example, an advantageous combination comprises a II–VI based photodetector input, fabricated for example in HgCdTe, as input, in combination with a III–V based VCSEL output, fabricated for example in GaAs.

In a first aspect, the present invention is an integrated electronic-optoelectronic module comprising: a composite substrate comprising a thin layer of silicon on a transparent, insulating substrate; at least one electronic device fabricated in the thin layer of silicon; and at least one optoelectronic device bonded to the composite substrate and in electrical communication with at least one electronic device fabricated in the thin layer of silicon. The optoelectronic device may be selected from lasers, light-emitting diodes, photodetectors, and modulators. The laser may further include a vertical cavity surface-emitting laser (VCSEL). The at least one electronic device may further include a CMOS electronic circuit for driving a VCSEL or an amplifier for the photodetector. In some configurations, the transparent, insulating substrate comprises sapphire.

In a second aspect, the present invention is an integrated electronic-optoelectronic module comprising: an ultrathin silicon-on-sapphire composite substrate; at least one electronic device fabricated in the ultrathin silicon; and at least one optoelectronic device bonded to the ultrathin silicon-on-sapphire composite substrate and in electrical communication with the at least one electronic device fabricated in the ultrathin silicon. The optoelectronic device may be selected from lasers, light-emitting diodes, photodetectors, and modulators. The laser may further include a vertical cavity surface-emitting laser (VCSEL). The at least one electronic device may further include a CMOS electronic circuit for driving a VCSEL or an amplifier for the photodetector.

In a third aspect, the present invention is a method for making an integrated electronic-optoelectronic module comprising the steps of: providing an ultrathin silicon-on-sapphire composite substrate having a main upper surface comprising a silicon layer; fabricating one or more electronic circuits in the silicon layer, including one or more bonding pad(s) in electrical contact with the one or more electronic circuits and arranged in a predetermined spaced-apart array; forming one or more optically transparent areas in the silicon layer correspondingly adjacent to the one or more electronic circuits; dicing the ultrathin silicon-on-sapphire composite substrate bearing the electronic devices, bonding pad(s), and optically transparent areas, to yield individual silicon-on-sapphire die each of which bears one or more electronic device, bonding pad, and optically transparent area; fabricating one or more optoelectronic devices on a suitable substrate, including one or more bonding pad(s) in electrical contact with the one or more optoelectronic devices and arranged in a predetermined spaced-apart array that matingly corresponds with the predetermined spaced-apart array of bonding pad(s) formed in the silicon-on-sapphire composite substrate; dicing the suitable substrate bearing the optoelectronic devices and bonding pad(s) to yield individual optoelectronic die, each of which bears one or more optoelectronic device and bonding pad; and combining the silicon-on-sapphire die with the optoelectronic die via their respective bonding pads by the technique of flip-chip bonding, to yield an integrated optoelectronic module. In some configurations, the suitable substrate for the optoelectronic device is a III–V material, e.g., GaAs. The optoelectronic device may be selected from lasers, light-emitting diodes, photodetectors, and modulators. The laser may further include a vertical cavity surface-emitting laser (VCSEL). The at least one electronic device may further include a CMOS electronic circuit for driving a VCSEL or an amplifier for amplifying a signal from the photodetector.

In a fourth aspect, the present invention is a method for making an integrated electronic-optoelectronic module comprising the steps of: providing an ultrathin silicon-on-sapphire composite substrate wafer having a main upper surface comprising a silicon layer; fabricating one or more electronic circuits in the silicon layer, including one or more bonding pad(s) in electrical contact with the one or more electronic circuits and arranged in a predetermined spaced-apart array; forming one or more optically transparent areas in the silicon layer correspondingly adjacent to the one or more electronic circuits; and fabricating one or more optoelectronic devices on a suitable substrate wafer, including one or more bonding pad(s) in electrical contact with the one or more optoelectronic devices and arranged in a predetermined spaced-apart array that matingly corresponds with the predetermined spaced-apart array of bonding pad(s) formed in the silicon-on-sapphire composite substrate wafer; and combining the electronic circuits on the silicon-on-sapphire composite substrate wafer with the optoelectronic devices on the suitable substrate wafer via their respective bonding pads by the technique of flip-chip bonding to yield a bonded structure; and dicing the bonded structure to yield hybrid integrated devices, each of which incorporates at least one optoelectronic device and at least one electronic circuit in electrical communication therewith.

In a fifth aspect, the present invention is an integrated electronic-optoelectronic interconnection comprising: an array in a first pattern of vertical-cavity surface emitting lasers formed on a first planar surface of a first suitable substrate, for generating output radiation at a desired wavelength of operation, said radiation being emitted orthogonal to and mainly directed into said first planar surface; an array in a second pattern of photodetectors formed on a second planar surface of a second suitable substrate, for detecting input radiation at a desired wavelength of operation, said photodetectors detecting radiation received on the second planar surface; an ultrathin silicon-on-sapphire composite substrate having a third planar surface bearing electronic circuitry for processing electrical signals generated by the input radiation to the photodetectors and controlling the output radiation of the vertical-cavity surface emitting lasers, wherein the ultrathin silicon-on-sapphire composite substrate is provided with optically transparent areas; and electrical contacts formed by flip-chip bonding the first and second planar surfaces to the third planar surface, electrically connecting the vertical-cavity surface emitting lasers formed on the first suitable substrate, the photodetectors formed on the second suitable substrate, and the electronic circuitry for processing electrical signals generated by the input radiation to the photodetectors and controlling the output vertical-cavity surface emitting lasers; wherein said electrical contacts being formed so that the first array of vertical cavity surface-emitting lasers and the second array of photodetectors respectively emit output radiation or detect input radiation through the optically transparent areas of the ultrathin silicon-on-sapphire composite substrate.

In a sixth aspect, the present invention is a method for fabricating an electronic-optoelectronic module comprising: providing a composite substrate comprising a thin layer of silicon on a transparent, insulating substrate, having a main upper surface comprising the thin layer of silicon; fabricating one or more electronic circuits in the thin layer of silicon using well-known micro-fabrication techniques, including one or more bonding pads in a pre-determined spaced-apart pattern, each in electrical communication with the one or more electronic circuits; forming one or more optically transparent areas in the thin layer of silicon correspondingly adjacent to the one or more electronic circuits; dicing the composite substrate bearing the electronic devices, the optically transparent areas, and the bonding pads to yield individual composite die each of which bears one or more electronic device, optically transparent area, and bonding pad in a pre-determined spaced-apart pattern in electrical communication with the electronic device; fabricating one or more optoelectronic devices on a suitable substrate including one or more bonding pads in a pre-determined spaced-apart pattern, each in electrical communication with one or more optoelectronic devices; providing bonding pads on the suitable substrate correspondingly adjacent to and in electrical communication with the one or more optoelectronic devices; dicing the suitable substrate bearing the optoelectronic devices and bonding pads to yield individual optoelectronic die each of which bears one or more optoelectronic device and bonding pads; and combining the composite substrate die with the optoelectronic die via the bonding pads by the technique of flip-chip bonding to yield an integrated optoelectronic module. In some configurations, the transparent, insulating substrate comprises sapphire.

These and other desirable characteristics are embodied in the present invention and will become apparent through reference to the following detailed description of the invention and accompanying drawings.

BRIEF DESCRIPTION OF THE DRAWINGS

FIG. 2C is a hybrid structure according to the present invention which includes both transmitting and receiving optoelectronic devices coupled to their respective electronic circuitry where both types of electronic circuitry are fabricated on the same ultra-thin silicon-on-sapphire composite substrate.

FIG. 3B is an exemplary depiction of an embodiment of the present invention, showing a parallel-channel point-to-point optical interconnect system using top-emitting lasers and frontside illuminated photodetectors integrated with controlling electronic circuitry fabricated in ultrathin silicon-on-sapphire composite substrates.

DETAILED DESCRIPTION OF THE INVENTION

Figure 1:
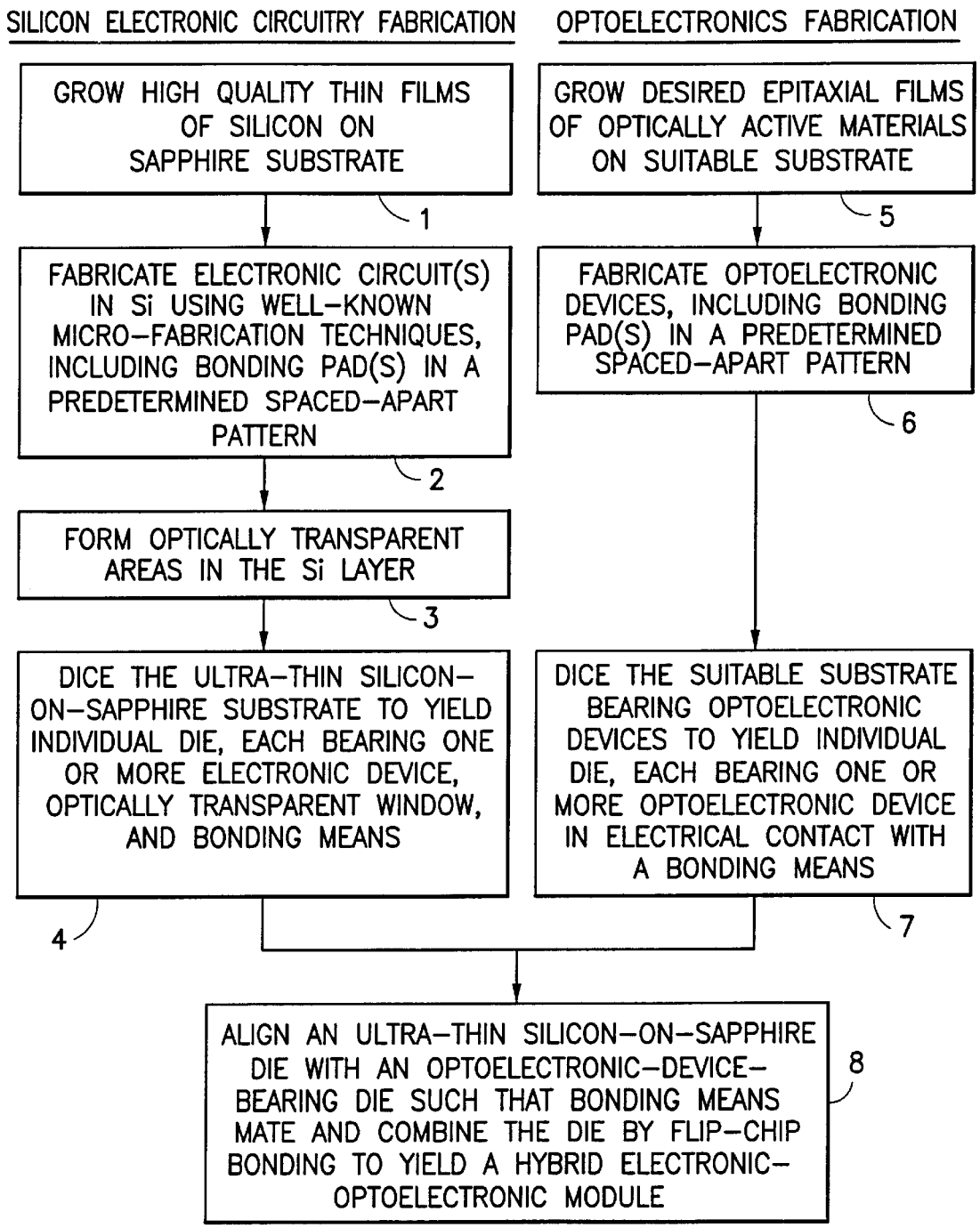
FIG. 1 is a flow diagram of an exemplary method according to the present invention for integrating optoelectronic devices with silicon electronic circuitry on an ultrathin silicon-on-sapphire composite substrate.

As used herein, the following terms are defined as follows:

"Ultrathin silicon-on-sapphire" refers to composite substrates comprising high quality thin films of silicon on sapphire, using the methods described in previously referenced U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555; the disclosures of each of which were incorporated by reference herein in their entirety. Typically, the thin silicon films are characterized by a thickness of less than approximately 150-nm.

"CMOS devices" refers to Complementary Metal Oxide Semiconductor devices such as MOSFETs which are fabricated in silicon. Silicon-based CMOS technology is capable of achieving an extremely high density of devices in consistently high yields.

"Optoelectronic devices" refers to devices that detect, emit, or modulate light. In the context of the present invention, such optoelectronic devices are fabricated in optically active materials that are selected to be optimal for the desired application. For example, III–V compound semiconductors typically detect, modulate or emit light. Optoelectronic devices may be fabricated using epitaxial layers on suitable substrates, for example, GaAs or InGaAs, or may be monolithic. Exemplary optoelectronic devices include but are not limited to surface-emitting lasers, photodetectors, light modulators, etc.

"Bonding pads" as used herein refers to regions of conductive material formed in a predetermined pattern on the surface of an electronic or an optoelectronic device, in electrical communication with the device. The conductive material is selected to be suitable for flip-chip bonding, according to criteria well known in the microelectronic fabrication art, (e.g., K. W. Goossen et al., *IEEE Photonics Technol. Lett.*, Vol. 5(7), pp. 776–778, 1994; more recently Pu et al., *J. Selected Topics Quantum Electronics*, Vol. 5, No. 2, pp. 201–207, 1999). The bonding pads may be used directly for the flip-chip bonding step, where they are placed in physical contact and exposed to heat and/or pressure, whereupon they fuse to form an electrically conductive physical bond. Alternatively, the bonding pads may be provided with a "solder bump," a material selected to fuse upon exposure to heat and/or pressure to provide an electrically conductive physical bond between the two bonding pads.

One configuration of the present invention provides integration by flip-chip bonding of electronic circuitry fabricated in silicon with optical and/or optoelectronic circuitry fabricated in other various suitable substrate materials. For example, this configuration includes the direct heterogeneous combination of CMOS chips fabricated in ultrathin silicon-on-sapphire composite substrates with optoelectronic devices (lasers, detectors, modulators, etc.) fabricated in III–V materials using well developed and commercially available flip-chip bonding techniques. The sapphire substrate is transparent from a wavelength of about 0.3 $\mu$m through about 10 $\mu$m. Transparent areas may be provided in the ultrathin silicon layer of the ultrathin silicon-on-sapphire composite substrate by etching or oxidizing the silicon to provide optical access through the ultrathin silicon-on-sapphire composite substrate to/from the optoelectronic devices as appropriate.

A general process for an exemplary configuration of the present invention is depicted schematically in the flow chart of FIG. 1, which shows integration of silicon electronic circuitry chips fabricated in ultrathin silicon-on-sapphire composite substrates with optoelectronic devices fabricated in other various suitable substrate materials, e.g., GaAs. The silicon electronic circuitry fabrication steps and the GaAs, Si, Ge, etc. optoelectronic device fabrication steps take place separately. Thus, the individual devices may be tested while still in wafer form, i.e., before dicing and assembly into the final integrated structure.

Silicon Electronic Circuitry Fabrication

As shown in operation block 1 of FIG. 1, high quality thin films of silicon are initially grown on sapphire substrates, using the methods described, e.g., in previously referenced U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555; the disclosures of each of which were incorporated by reference herein in their entirety. A general process for forming the high quality silicon-on-sapphire composite substrates comprises the steps of: epitaxially depositing a layer of silicon on a surface of a sapphire substrate; implanting a given ion species into the layer of silicon under such conditions that the implanted ions form a buried amorphous region in the silicon layer which extends substantially from the surface of the sapphire substrate into the layer of silicon, thus leaving a surface layer of monocrystalline silicon covering the buried amorphous region; maintaining the silicon layer at or below a predetermined temperature such that the temperature throughout the silicon layer is substantially uniform during the ion implanting step; and annealing the wafer to induce solid phase epitaxial regrowth of the buried amorphous region using the surface layer of monocrystalline silicon as a crystallization seed. This process is capable of producing a high quality silicon layer on a sapphire substrate, i.e., a silicon layer having an areal density of electrically active states in regions not intentionally doped which is less than approximately $5 \times 10^{11}$ cm$^{-2}$. The high quality of the silicon layer may be preserved during device fabrication in the silicon layer by performing any processing which subjects the silicon layer to temperatures in excess of approximately 950° C. in an oxidizing ambient environment, and performing any processing which subjects the silicon layer to temperatures which are less than approximately 950° C. in either one of an oxidizing ambient environment or a non-oxidizing ambient environment.

Operation block 2 illustrates the fabrication, on the high quality ultrathin silicon-on-sapphire composite substrate, of the electronic circuits required to control optoelectronic devices, e.g., drivers for a VCSEL, amplifiers for the input from a photodetector, etc., using fabrication techniques well-known to microelectronics practitioners. Such techniques are described in standard references such as *Silicon Processing for the VLSI Era, Volume 3: The Submicron MOSFET* (S. Wolf, Lattice Press, Sunset Beach, Calif.: 1995); *VLSI Technology, Second Edition* (Edited by S. M. Sze, McGraw-Hill, New York, 1988). Design of such silicon-based electronic circuitry is readily accomplished by integrated circuit design practitioners. Fabrication technology for such silicon-based electronic circuitry is also well-known.

In some configurations of the invention, the silicon electronic circuitry includes VCSEL drivers (e.g., CMOS) for powering and controlling surface-emitting lasers. The VCSEL drivers are integrated with the VCSEL lasers by flip-chip bonding. A CMOS VCSEL driver has been described and analyzed by Lawler et al. (Lawler et al., "CMOS Drive Circuit for Hybrid Optical Interconnects," *Proc. 2$^{nd}$ Intl. Workshop on Design of Mixed-Mode Integrated Circuits and Applications*," Guanajuato, Mexico, p. 29–32, Jul. 27–29, 1998; Lawler, B. "CMOS Drive Circuit for Opto-Electronic Readout of Image Sensors," *Proc.* 1999 *IEEE Intl. Symp. Circuits and Systems*, vol. V, pp. V124–V127, Orlando, Fla., May 30, 1999).

As shown in operation block 3 of FIG. 1, transparent areas in the ultrathin silicon layer in the areas of the intended attachment sites of the optoelectronic devices may be provided for optical access on as as-needed basis. Transparent areas may be provided by etching the silicon. Alternatively, any non-device areas may be oxidized to $SiO_2$, which is optically clear.

The electronic circuitry is in electrical communication with regions of conductive material which are provided for forming contacts by flip-chip bonding ("bonding pads") in appropriate sites where electrical connection to optoelectronic devices is intended to be made. Techniques for flip-chip bonding have become well-known to microelectronics practitioners. For example, Pu et al. (*J. Selected Topics Quantum Electronics*, Vol. 5, No. 2, pp. 201–207, 1999) briefly reviewed earlier methods, and developed and compared three new methods for bonding VCSELs to CMOS integrated circuit chips. The methods examined involved coplanar flip-chip bonding using the thermocompression of a gold post into indium-tin solder, top-bottom contact bonding using a solder bond, and top contact bonding wherein the VCSEL is attached to the electronic chip with epoxy.

Bonding pads are provided for both the silicon and the optoelectronic chips to enable the formation of a conductive bond between the chips by flip-chip bonding. For example, the electronic devices on the ultrathin silicon-on-sapphire composite substrate are formed in electrical communication with conductive pads which comprise a conductor, typically aluminum. In some applications, the bonding pads are formed in a pre-determined spaced-apart pattern for mating with bonding pads in a mirror-image spaced apart pattern to be provided in the optoelectronic chip. The conductive bonding pads on the silicon chip may be provided with a solder ball, or alternatively the solder ball may be provided on the bonding pads of the optoelectronic chip.

In the practice of the invention, an appropriate bonding technique is selected based on the overall integrated device configuration and properties desired. For example, in some configurations, the bonding pads provided to the ultrathin silicon-on-sapphire chip comprise the well-known metal composition Al—Si—Cu.

While still at the wafer level, the electronic devices may conveniently be tested. Testing the devices before dicing and individual device integration provides advantages in terms of economics and overall yield of integrated devices.

As shown in operation block 4 of FIG. 1, the ultrathin silicon-on-sapphire wafer is then diced to yield a number of ultrathin silicon-on-sapphire die, each of which contains one or more electronic device(s), optically transparent area(s), and bonding pad(s) in electrical communication with the electronic device(s). Alternatively, the ultrathin silicon-on-sapphire wafer may be bonded to the optoelectronic wafer prepared as described below. Wafer-level bonding followed by dicing may provide production cost advantages under some circumstances, such as dense two-dimensional array optoelectronic interconnects.

Optoelectronic Device Fabrication

Referring to operation block 5 of the flowchart in FIG. 1, the first step in optoelectronic device fabrication comprises growth of desired epitaxial films of optoelectronic materials on suitable substrates. Typical III–V materials include epitaxial films of GaAs, AlGaAs, on GaAs substrates and InP and related III–V alloys on InP substrates. Other optical materials include II–VI compounds, for example, HgCdTe grown on CdTe substrates, liquid crystal and other optoelectronic polymers, and crystalline oxides such as lithium niobate and lithium tantalate. For epitaxial materials, the suitable substrate is selected based on its properties in relation to the epitaxial films of optoelectronic materials, e.g. lattice match, closeness of coefficient of thermal expansion, etc. An advantage of the flip-chip bonding approach is that the optoelectronic device is performance-optimized separately from the silicon electronics, rather than being required to be grown on a common substrate. The optoelectronic device is grown in a material selected for its own optimal performance, and later bonded to the high speed electronic device, which is likewise fabricated in a material selected for optimal performance of the electronic device. Methods for epitaxial growth of optoelectronic materials to form various optoelectronic devices are well-known to microelectronics practitioners. Epitaxial films of optoelectronic materials well-suited for further processing steps may also be obtained commercially (e.g., Epitronics Corp., Phoenix, Ariz.).

Operation block 6 of FIG. 1 illustrates the fabrication of optoelectronic devices in the epitaxial films. Useful optoelectronic devices include lasers, photodetectors, modulators, etc. Such devices are well-known (see e.g., *Quantum Electronics*, Yariv, A., John Wiley & Sons, New York: 1967; *Fundamentals of Photonics*; Saleh, B. E. A., and Teich, M. C.; John Wiley & Sons, New York: 1991). Additionally, many optoelectronic devices are commercially available in the form of single devices or arrays of devices. For example, GaAs and Si photodetector arrays are available commercially (Anadigics Corp., Warren, N.J.), as are AlGaAs/GaAs VCSEL arrays (Emcore Corp. MODE Division, Albuquerque, N.Mex.).

In one configuration of the present invention, the optoelectronic devices are VCSELs and photodetectors. Fabrication of VCSELs is known (see Carl Wilmsen, Henryk Temkin, and Larry A. Coldren, *Vertical-Cavity Surface-Emitting Lasers, Design, Fabrication, Characterization,* and *Applications*, Cambridge University Press, ISBN 0 521 59022, 1999). VCSELs that emit light in the infrared wavelengths are available, but for optoelectronic switching applications VCSELs emitting in the near-visible range, preferably at wavelengths below about 1 µm, are preferred. Such VCSELs are available commercially or may be fabricated individually or in arrays. Typically, VCSELs emit most of their radiation in a cone orthogonal to and out of the substrate they are grown on. However, since mirror technology is not perfect, some radiation may also be emitted into the substrate.

The optoelectronic device(s) are provided with and are in electrical contact with regions of conductive material for forming contacts by flip-chip bonding ("bonding pads"), in appropriate sites where electrical connection to the silicon electronic device(s) is intended to be made. Flip-chip solder bump bonding of GaAs-based devices onto silicon integrated circuits is known (e.g., K. W. Goossen et al., *IEEE Photonics Technol. Lett.*, Vol. 5(7), pp. 776–778, 1994; more recently Pu et al., *J. Selected Topics Quantum Electronics*, Vol. 5, No. 2, pp. 201–207, 1999). In the practice of the invention, an appropriate bonding technique is selected based on the overall integrated device configuration and properties desired. For example, in one configuration, the metallurgical system comprises Au:Ge at the eutectic ratio (approximately 80:20).

While still at the wafer level, the optoelectronic devices may conveniently be tested. Testing the devices before dicing and individual device integration provides advantages in terms of economics and overall yield of integrated devices.

As shown in operation block 7 of FIG. 1, the optoelectronic wafer is then diced to yield a number of optoelectronic die, each of which contains one or more optoelectronic device(s) and bonding pad(s) in electrical communication with the optoelectronic device(s) designed to be mated with the bonding pads on the ultra-thin silicon-on-sapphire die. Alternatively, the optoelectronic wafer may be bonded to the ultrathin silicon-on-sapphire wafer prepared as described above. Wafer-level bonding followed by dicing may provide production cost advantages under some circumstances, such as dense two-dimensional array optoelectronic interconnects.

Hybrid Integration

As shown in operation block 8 of FIG. 1, the final steps comprise combining the electronic and optoelectronic devices using the well-established technique of flip-chip die/wafer attaching followed by packaging the resulting integrated devices in standard high-speed electronics packages which include appropriate optical window(s). The one or more bonding pads on the ultrathin silicon-on-sapphire die have been patterned to match up with mirror image patterns of one or more bonding pads on the optoelectronics die, thereby enabling the formation of one or more electrical contacts between the two die.

Applications

Figure 2A:
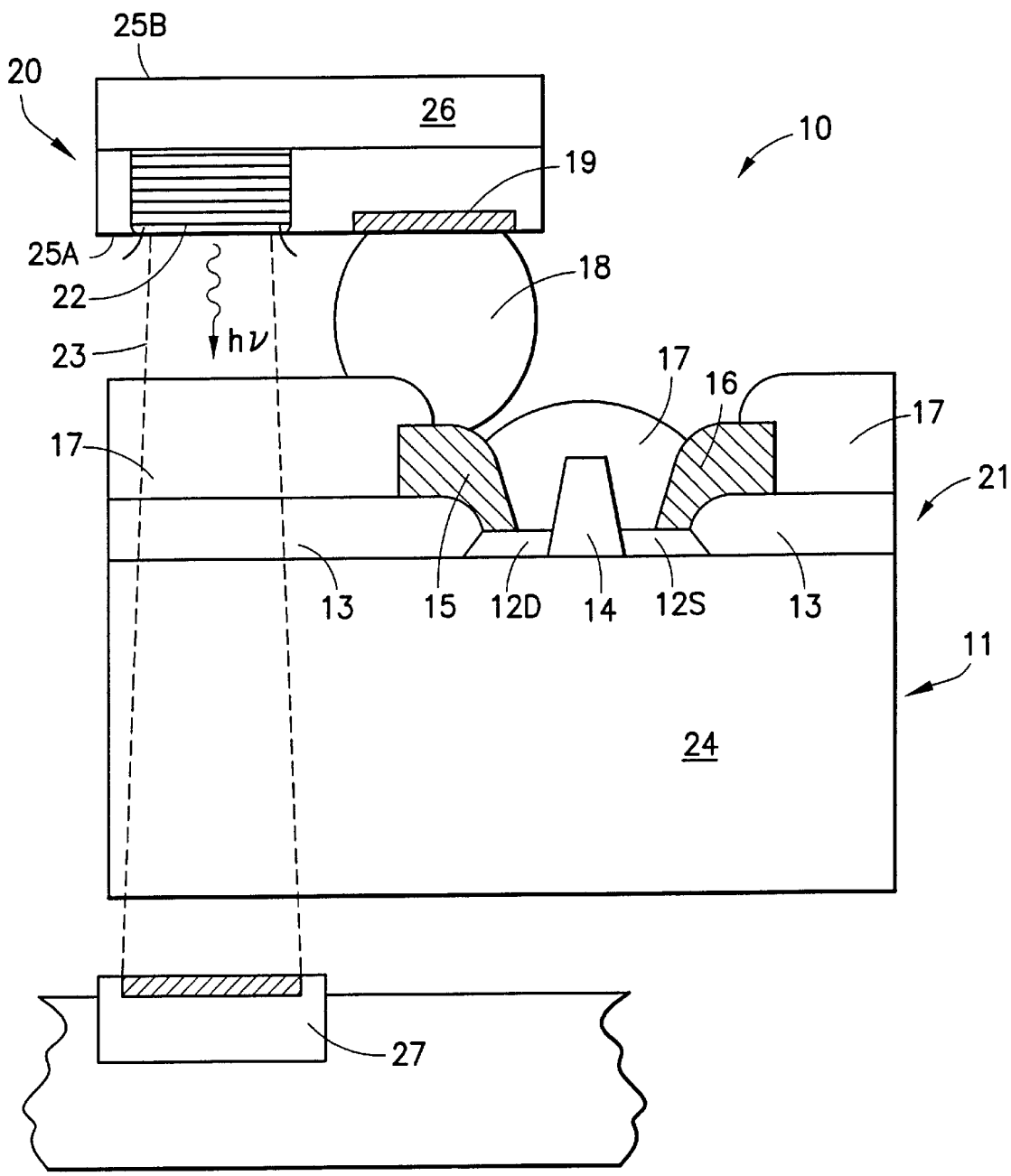
FIG. 2A is an exemplary depiction of an embodiment of the invention, showing integration of a top-emitting VCSEL and a MOS transistor on an ultrathin silicon-on-sapphire composite substrate.

FIG. 2A is a schematic cross-sectional view of an embodiment of the invention showing integration of a top-emitting VCSEL 20 and a MOS transistor 21 on an ultrathin silicon-on-sapphire composite substrate 11, thus forming an integrated module 10. The VCSEL 20 is fabricated on a substrate 26 and includes an optical window 22 and a bonding pad 19 for making electrical contact with the VCSEL 20 via, e.g., a VCSEL p-contact or n-contact. The MOS transistor 21 is fabricated in the thin silicon layer on the sapphire substrate 24 of the ultrathin silicon-on-sapphire composite substrate 11. MOS transistor 21 includes doped silicon source region 12S, doped silicon drain region 12D, gate region 14, conductive source terminal 16 and conductive drain terminal 15. The VCSEL 20 bonding pad 19 forms an electrical contact between the VCSEL 20 and the MOS transistor 21 via solder bump 18 to drain terminal conductor 15 which is in electrical contact with the doped silicon drain region 12D of the MOS transistor 21. Oxide layers 13 and 17 have the advantage that $SiO_2$ is optically transparent. Thus, a light (hv) beam 23 emitted from the top-emitting VCSEL 20 optical window 22 may pass through the oxide layers 13, 17 as well as the transparent sapphire substrate 24 portion of the ultrathin silicon-on-sapphire composite substrate 11. Upon exit from the transparent sapphire substrate 24, the light beam 23 can be received by another optical element 27 for communication or switching applications. Virtually any type of optical element is suitable for receiving light from the VCSEL 20 including photodetectors, photomodulators, etc.

Figure 2B:
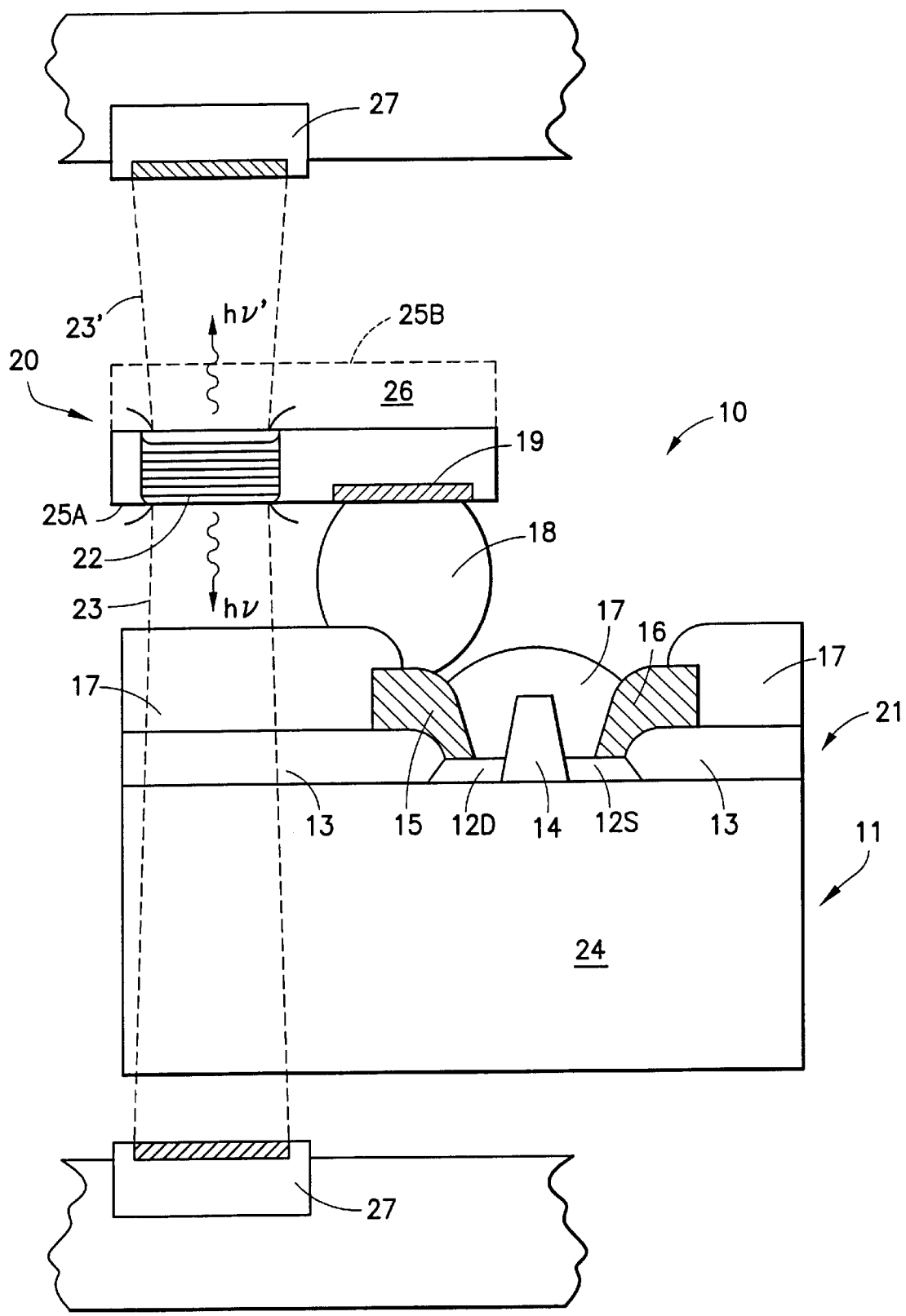
FIG. 2B is an exemplary depiction of an embodiment of the invention, showing integration of a VCSEL which is both top-emitting and bottom-emitting with a MOS transistor on an ultrathin silicon-on-sapphire composite substrate.

Another configuration of the present invention, which is a modification of the configuration shown in FIG. 2A, is shown in FIG. 2B (where the numerals have the same meanings as defined for FIG. 2A). FIG. 2B shows an optoelectronic up-down interconnect constructed by an advantageous combination of the top-emitting configuration shown in FIG. 2A with previous technology for bottom-emitting devices. In this configuration, VCSEL 20 emits light (hv and hv') from both ends of its cavity through top surface 25A (hv) and bottom surface 25B (hv'), i.e., the VCSEL 20 operates simultaneously as top-emitting and bottom-emitting. In this embodiment, removal of the substrate 26 on which the VCSEL 20 is fabricated may be required for 850-nm VCSELs. Alternatively, the up-down interconnect may employ 980-nm VCSELs which can include both up and down light emission (i.e., bottom-emitting and top-emitting) without substrate 26 removal. Substrate 26 is shown in dashed lines in FIG. 2B to indicate that it may be removed to facilitate transmission of shorter wavelengths, e.g., 850-nm.

As shown in FIG. 2B, light hv which is emitted from the surface 25A of the VCSEL 20 is referred to as "top-emitting" and light hv' which is emitted from the surface 25B is referred to as "bottom-emitting". The main difference between "top-emitting" and "bottom-emitting" light is that "bottom emitting" light passes through the substrate 26 of the VCSEL 20. Longer wavelength infra-red (IR) radiation (e.g., 980-nm) passes through typical VCSEL substrate 26 materials such as GaAs. However, GaAs is opaque for radiation in the shorter wavelength IR range (e.g., 850-nm) and beyond. Thus, for these shorter wavelengths, it may be necessary to remove the VCSEL substrate 26 (as indicated by the dashed lines in FIG. 2B) to use the "bottom emitting" light hv'. VCSEL substrate removal as well as other bottom-emitting applications are described in some of the publications previously discussed in the "Background of the Invention" section of this document.

The FIGS. 2A and 2B hybrid structures of the present invention are distinguished from previously described hybrid chips in that the light hv from the VCSEL is "top:emitting", i.e., it does not pass through the substrate 26 on which the VCSEL 20 is fabricated, typically GaAs. Additionally, the top-emitted light hv from the VCSEL 20 is directed through the transparent sapphire substrate 24 on which the electronic circuitry 21 is fabricated as opposed to being directed through the bottom surface 25B of the VCSEL chip 20 and away from the electronic circuitry 21. Consequently, the present invention avoids many of the problems associated with prior hybrid chip configurations.

For example, one prior configuration requires that the optoelectronic device (VCSEL) be provided with an etch-stop layer between the VCSEL device and the substrate 26 to facilitate removal of the VCSEL substrate 26 by etching. Alternatively, the VCSEL substrate 26 may be removed by mechanical polishing or combinations of etching and mechanical polishing to enhance performance of the bottom-emitting optoelectronic device. In some instances, the up-down configuration shown in FIG. 2B must still address the same issues for the bottom-emitting portion of the light hv', i.e., substrate etching/removal may be required.

In the configurations of FIGS. 2A and 2B, the optoelectronic device 20 is shown as a VCSEL, a light or electromagnetic radiation producing/transmitting device. However, it is to be understood that the above discussion also applies to similar configurations where the VCSEL is replaced by a photodetector, a light or electromagnetic radiation detecting/receiving device. Additionally, as shown in FIG. 2C, hybrid structures according to the present invention may include both transmitting 20 and receiving 27' optoelectronic devices coupled to their respective electronic circuitry 21,21' where both types of electronic circuitry are fabricated on the same ultra-thin silicon-on-sapphire composite substrate 11. The transmitting and receiving optoelectronic devices 20,27' may also be fabricated on the same substrate 26 or separate substrates. For example, the basic structure of a VCSEL may be used to produce both transmitting and receiving devices. An example of one configuration of the present invention where both transmitting and receiving optoelectronic devices are coupled to their respective electronic circuitry (which is fabricated on the same ultra-thin silicon-on-sapphire composite substrates 11) is a bi-directional parallel-channel point-to-point optical interconnect as shown in FIG. 3C.

Another advantage of hybrid structures such as the structures shown in FIGS. 2A, 2B and 2C is that transfer of electronic signals from the electronic circuitry 21,21' (fabricated on the ultra-thin silicon-on-sapphire composite substrate 11) to the optoelectronic device(s) 20, 27' occurs with almost zero electrical parasitics. This is due in part to the use of solder bumps 18, 18' for making electrical connections between the optoelectronic device(s) 20,27' and the electronic circuitry 21,21', as opposed to conventional alternatives such as bonding wire and conductive vias. For example, a solder bump typically has an inductance of less than about 0.05 nH, as compared to 1–5 nH for a bonding wire, a conventional alternative. Another feature of the present invention which contributes to the extremely low level of electrical parasitics is the fabrication of the electrical circuitry 21,21' on the ultra-thin silicon-on-sapphire composite substrate 11. For example, in more traditional bulk silicon electronic devices, the capacitance between the bonding pads and the bulk silicon substrate is typically about 0.1 to 1 pF. By way of contrast, in the configurations of the present invention shown in FIGS. 2A, 2B and 2C where the electronic circuitry 21,21' is fabricated on the ultra-thin silicon-on-sapphire composite substrate 11, the bond pad capacitance is about 0.05 pF. These reduced interconnect parasitics of the present invention result in higher speed, less cross-talk, lower power and lower noise at the system level. Also, in previously described hybrid chips, the combination of higher inductance and capacitance can cause frequency filtering, which is not permitted in data communications, which are broadband systems.

Figure 3A:
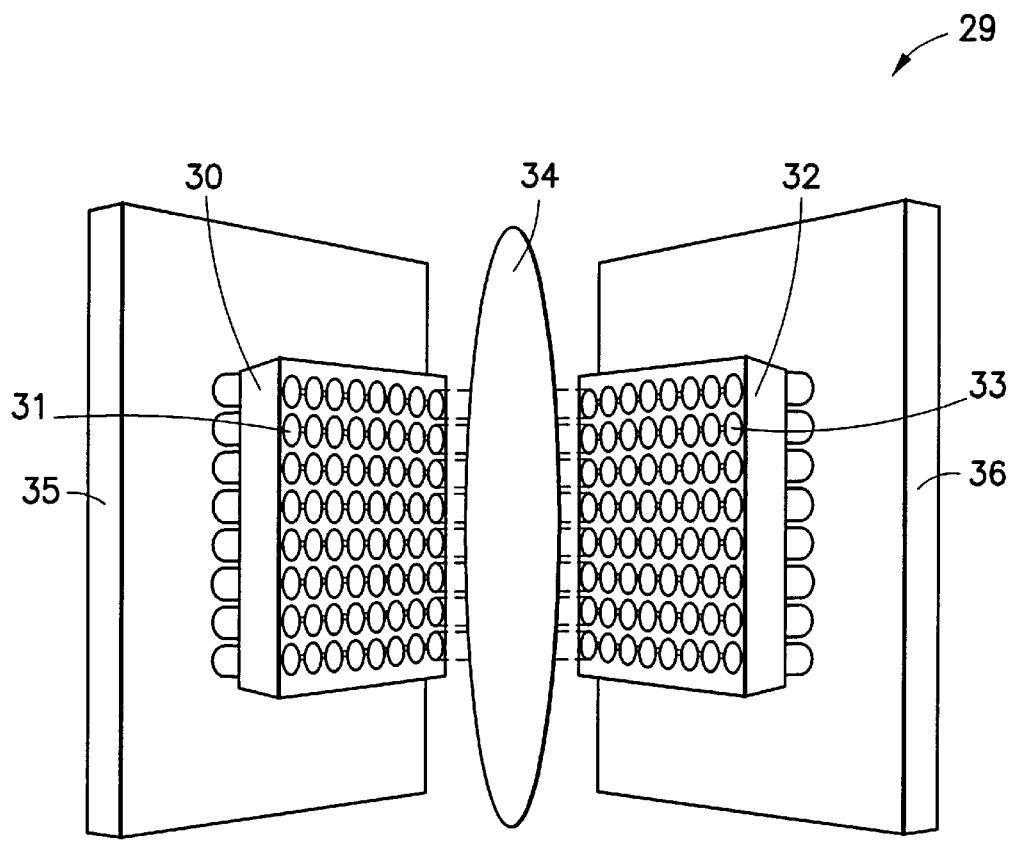
FIG. 3A is a parallel-channel point-to-point optical interconnect system using bottom-emitting lasers and backside illuminated photodetectors integrated with controlling electronic circuitry.

FIG. 3A illustrates a parallel-channel point-to-point optical interconnect configuration 29 as assembled and characterized by Simonis, et al. ("Research on VCSEL interconnects and OE processing at Army Research Laboratory", *Proc. SPIE*, 3946, paper #28, SPIE Photonics West, San Jose, Calif., Jan. 22–28, 2000, the contents of which are hereby incorporated herein by reference). The system 29 includes an 8×8 transmitter array 30 of substrate emitting (i.e., bottom-emitting) InGaAs-quantum-well VCSELs 31 as transmitters, an 8×8 receiver array 32 of backside illuminated InGaAs/InP photodetectors 33 as receivers, and a compound lens 34 to optically couple them. As previously discussed, if 980-nm bottom-emitting VCSELs 31 on a GaAs substrate are used, the GaAs substrate need not be removed since the GaAs is relatively transparent to 980-nm radiation. Alternatively, if 850-nm bottom-emitting VCSELs 31 on a GaAs substrate are used, the GaAs substrate must be removed since the GaAs is relatively opaque to 850-nm radiation. The VCSEL 31 and photodetector 33 arrays 30,32 are positioned relative to the compound lens 34 such that one-to-one magnification is achieved from the VCSEL array 30 to the image projected onto the detector array 32. The lens 34 (made by Universe Kogaku Inc.) has the following characteristics: 13.0-mm focal length, 6.76-mm back focal length, 5.36×4.01-mm format size, and fl 1.12. The VCSELs 31 have oxideaperture diameters in the range of 5 to 6-$\mu$m on 125-$\mu$m pitch and were flip-chip bonded to a CMOS driver array 35. The photodetectors 33 each have a 40-$\mu$m diameter on a 125-$\mu$m pitch and were flip-chip bonded to a Si fan-out pad array 36. The integrated VCSEL and photodetector arrays were packaged in 68-pin-grid-array (PGA) packages, which were then attached to a printed circuit board (PCB) for mechanical support and for mounting of external electronic components. The PCB and lens were then mounted on translation and tilt stages for alignment and testing. The VCSEL array 30 and the detector array 32 were aligned to each other in such a way that all 64 optoelectronics links were functional and optimized.

FIG. 3B shows a parallel-channel point-to-point optical interconnect configuration 40 according to the present invention. The parallel-channel point-to-point optical interconnect configuration 40 comprises an 8×8 array 48 of top-emitting VCSELs 43,47 as transmitters/outputs, an 8×8 array 45 of frontside illuminated photodetectors 42,46 as receivers/inputs, on appropriate substrates, and controlling CMOS circuitry 41,49 provided on ultrathin silicon on sapphire composite substrates. Compound lens 44 optically couples the optical inputs and outputs. In a comparison of the two parallel-channel point-to-point optical interconnect configurations 29,40 shown in FIGS. 3A and 3B, it is seen that the major differences between these two configurations 29,40 are as follows: 1) the FIG. 3B device 40 utilizes top-emitting VCSELs 43,47 while the FIG. 3A device 29 utilizes bottom-emitting VCSELs 31; and 2) the FIG. 3B device 40 utilizes frontside illuminated photodetectors 42,46 while the FIG. 3A device 29 utilizes backside illuminated photodetectors 33. Utilization of both top-emitting VCSELs 43,47 and frontside illuminated photodetectors 42,46 is made possible by the features of the present invention whereby the optoelectronic devices (VCSEL's and photodetectors) are flip-chip bonded to their respective electronic circuits 41,49 which are fabricated on the ultra-thin silicon-on-sapphire composite substrate, thereby allowing electromagnetic radiation (light) to pass through the sapphire substrate on which the electronic circuits are fabricated. Many of the advantages of this configuration 40 have been previously discussed with respect to FIGS. 2A, 2B and 2C.

Figure 3D:
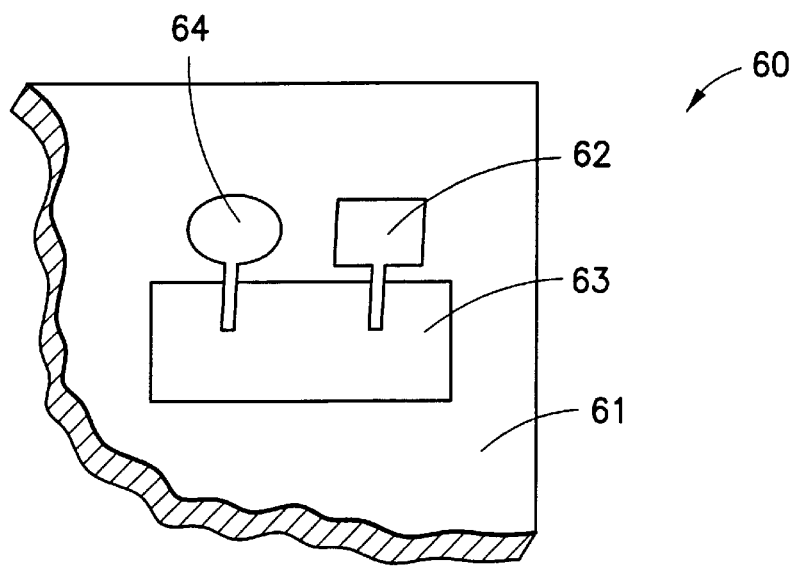
FIG. 3D is detailed portion of FIG. 3C showing one element the system including a VCSEL, photodetector and CMOS circuitry based on an ultrathin silicon-on-sapphire composite substrate.
Figure 3C:
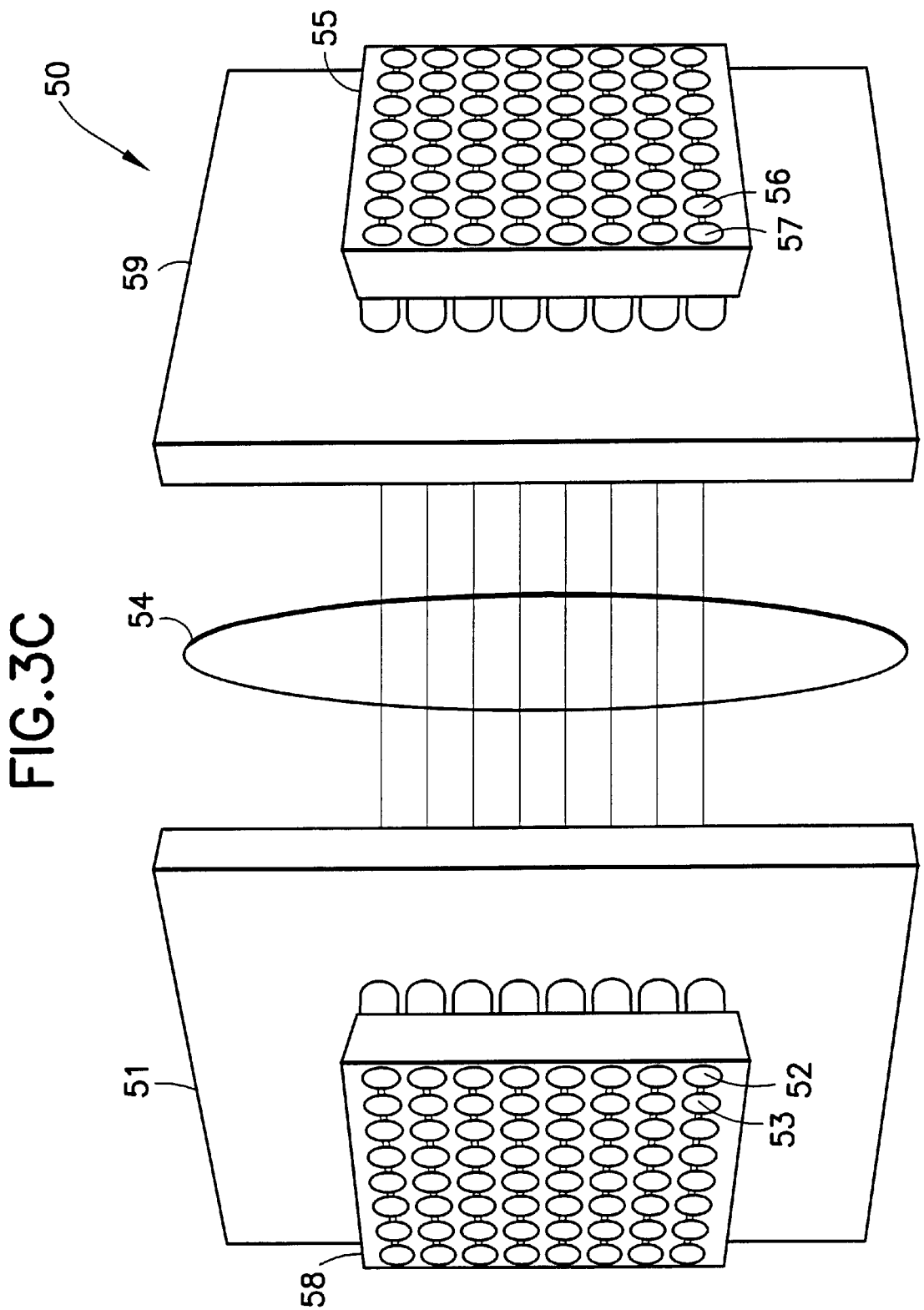
FIG. 3C is an exemplary depiction of an embodiment of the present invention, showing a bi-directional parallel-channel point-to-point optical interconnect system using top-emitting lasers and frontside illuminated photodetectors integrated with controlling electronic circuitry fabricated in ultrathin silicon-on-sapphire composite substrates.

FIG. 3C shows a bi-directional parallel-channel point-to-point optical interconnect configuration 50 according to the present invention. The parallel-channel point-to-point optical interconnect configuration 50 comprises first and second 8×8 arrays 55,58 wherein each 8×8 array comprises both top-emitting VCSELs (as transmitters/outputs, e.g., 53 and 57) and frontside illuminated photodetectors (as receivers/inputs, e.g. 52 and 56) on an appropriate substrate 55,58. The first and second 8×8 arrays 55,58 are substantially identical with the exception that the locations of the VCSELs 53,57 and photodetectors 52,56 on the two arrays 55,58 are reversed, i.e., mirror images. Thus, when the first array 55 is positioned such that it faces the second array 58, the VCSEL 57 on the first array 55 transmits light which is received by the photodetector 52 on the second array 58. Similarly, VCSEL 53 on the second array 58 transmits light which is received by the photodetector 56 on the first array 55. CMOS control circuitry 51,59 for both the top-emitting VCSELs 53,57 and the frontside illuminated photodetectors 52,56 is provided on an ultrathin silicon on sapphire composite substrate. Compound lens 54 optically couples the first and second arrays 55,58 optical inputs and outputs. FIG. 3D shows one transmitter/receiver pair 60 of such a system comprising a VCSEL 64, a photodetector 62 and CMOS circuitry 63 based on an ultrathin silicon-on-sapphire composite substrate 61.

In operation, the hybrid integrated electronic-optoelectronic modules 50 shown in FIG. 3C function as a free-space optical interconnect system. Each hybrid module contains a two-dimensional array 55,58 of VCSELs 53,57 and photodetectors 52,56 along with associated CMOS electronic driver/processing circuitry 51,59. Light emitted by the VCSELs 53,57 passes through the sapphire substrate of the electronic driver/processing circuitry 51,59 and is collected by the lens 54 disposed between the two modules. The lens 54 images the light from the VCSELs 53 on the first module onto detectors 56 on the second module and vice-versa. This simple free-space optical interconnect system is capable of establishing a bi-directional data link between two CMOS chips containing complex electronic circuits. This data link may include several thousand optical beams (corresponding to a two-dimensional array of, for example, 32×32 VCSELs and detectors) each carrying at or over 1 Gigabit/second data rate for an aggregate throughput of over 1 Terabit/second. Such a throughput is not achievable with conventional electronic interconnects, without significantly higher power dissipation and latency.

Although this example shows two modules communicating with each other in a simple manner, the same principle can be extended to establish communication between many chips and implement multi-stage switching networks (M. W. Haney et al., "Multi-Chip Freespace Global Optical Interconnection Demonstration with Integrated Arrays of Vertical-Cavity Surface-Emitting Lasers and Photodetectors," *Applied Optics*, Vol. 38, No. 29, pp. 6190–6200, Nov. 10, 1999). The specific case shown here is based on VCSELs used as optical transmitters. Optical modulators can equivalently be used as optical transmitters without affecting the overall operation of the system.

Figure 3E:
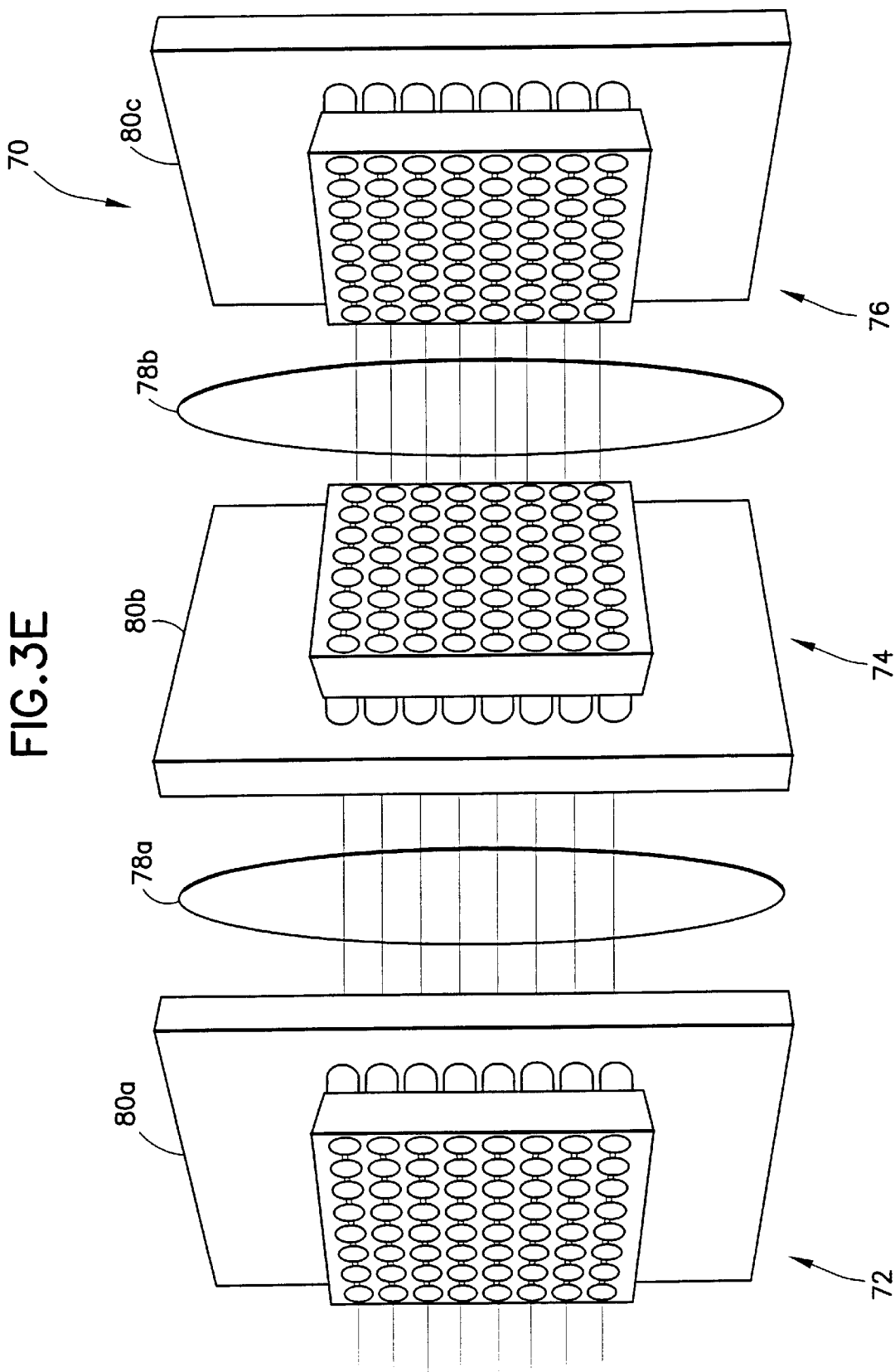
FIG. 3E is an exemplary depiction of an embodiment of the present invention showing a multi-level bi-directional parallel-channel point-to-point optical interconnect system using top-emitting and bottom-emitting lasers and frontside and backside illuminated photodetectors integrated with controlling electronic circuitry fabricated in ultrathin silicon-on-sapphire composite substrates.

Shown in FIG. 3E is an exemplary depiction of an embodiment of the present invention showing a multi-level bi-directional parallel-channel point-to-point optical interconnect system 70 using top-emitting and bottom-emitting lasers and frontside and backside illuminated photodetectors integrated with controlling electronic circuitry fabricated in ultrathin silicon-on-sapphire composite substrates. The multi-level configuration 70 includes three hybrid integrated electronic-optoelectronic modules 72,74,76, optically coupled by lenses 78a, 78b. Each hybrid module 72,74,76 includes transmitters, e.g., VCSEL's, which may operate as top-emitting and/or bottom-emitting (e.g., see FIG. 2B) and photodetectors which may also operate as frontside illuminated and/or backside illuminated. Thus, the multi-level configuration 70 includes optical coupling in both directions from each individual layer/hybrid module 72,74,76. This versatility is made possible by the present invention whereby the optoelectronic devices (transmitters and receivers) are flip chip mounted to silicon electronic circuitry 80a, 80b, 80c which is fabricated in ultrathin silicon-on-sapphire composite substrates, thereby enabling both top-emitting and/or bottom-emitting transmitters and frontside illuminated and/or backside illuminated photodetectors to transmit/receive light through the sapphire substrate. Many variations of this general multi-level configuration are possible, including but not limited to those discussed throughout this document. For example, the modules may include transmitters only (e.g., array 48 as shown in FIG. 3B), receivers only (e.g., array 45 as shown in FIG. 3B) or both transmitters and receivers (e.g., arrays 55,58 as shown in FIGS. 3C and 3D). Additionally, the optical interconnect systems discussed herein (see FIGS. 3A, 3B, 3C and 3E) show free-space optical coupling using lenses. However, these systems may also use other forms of optical coupling including but no limited to fiber-coupled interconnects.

Figure 4:
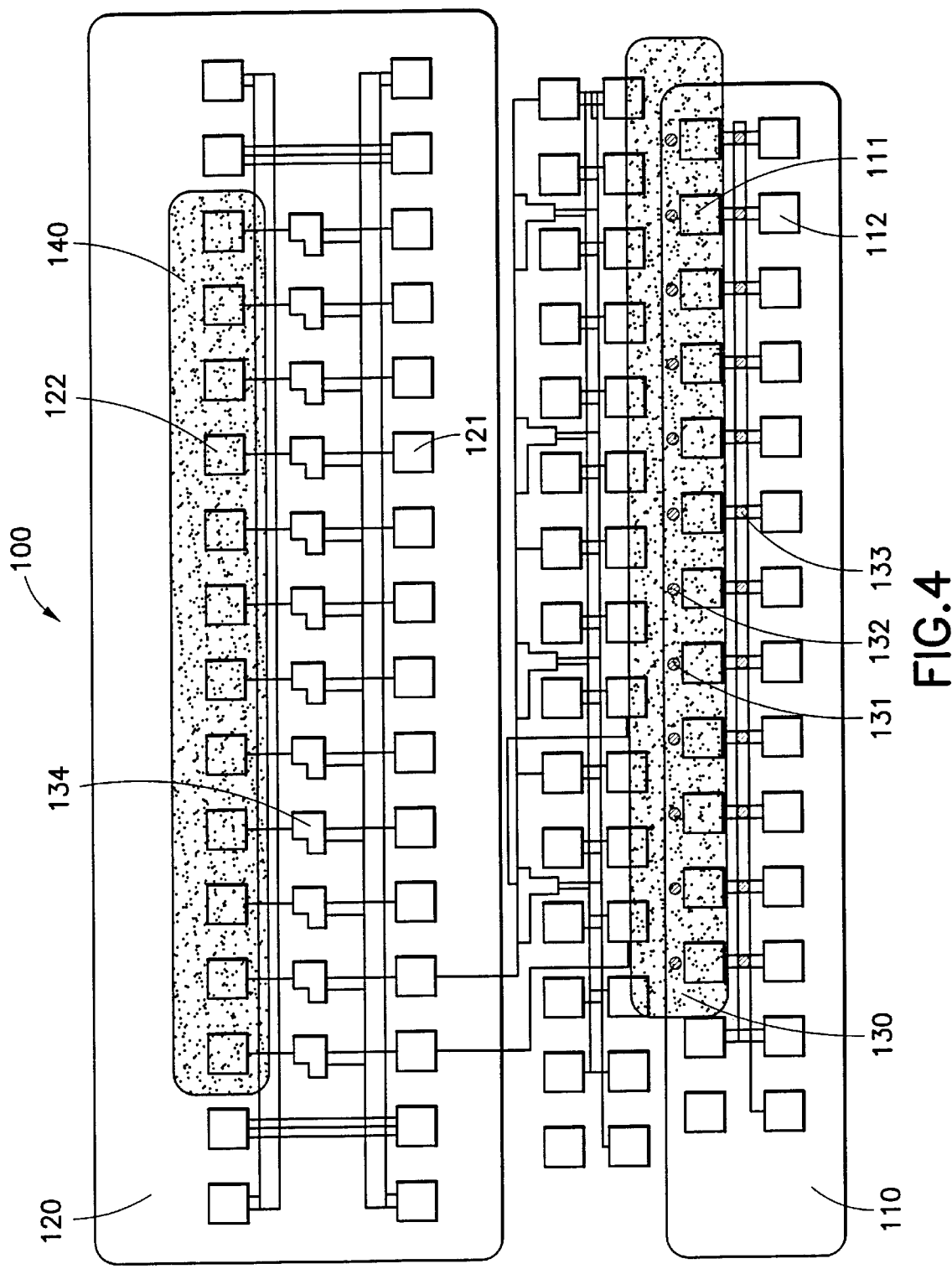
FIG. 4 is an exemplary depiction of an embodiment of the invention, showing an array of surface-emitting lasers and an array of photodetectors integrated with controlling electronic circuitry on a common ultrathin silicon-on-sapphire composite substrate for optoelectronic switching applications.
Figure 5:
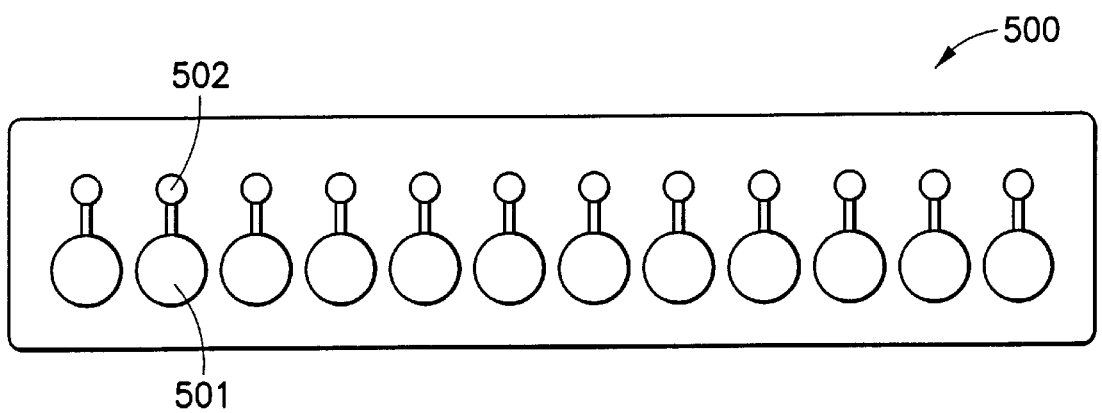
FIG. 5 shows a diagram of a VCSEL array as employed in the FIG. 4 embodiment.
Figure 6:
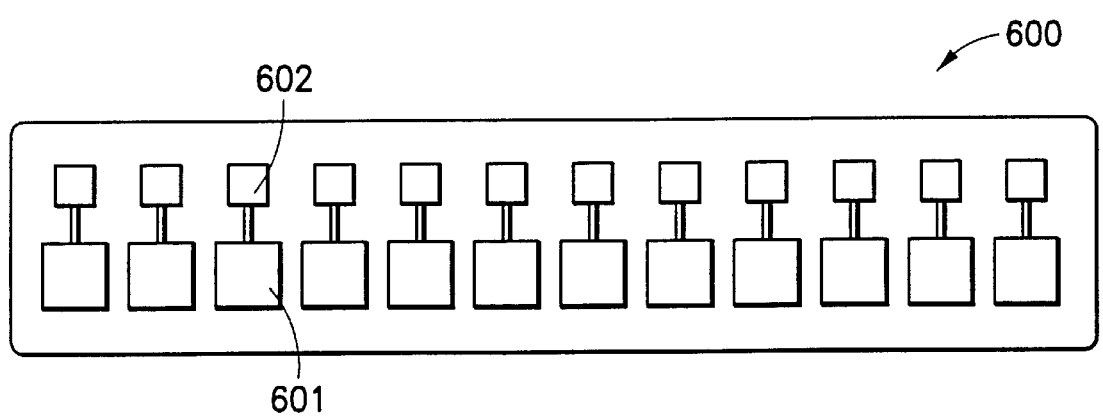
FIG. 6 shows a diagram of a photodetector array as employed in the FIG. 4 embodiment.

FIGS. 4, 5 and 6 are schematic depictions of another embodiment of the invention for optoelectronic switching applications. This embodiment comprises a 12×1 array 500 of surface-emitting lasers (VCSELs) 502 and a 12×1 array 600 of photodetectors 602 integrated with controlling CMOS electronic circuitry on a common ultrathin silicon-on-sapphire composite substrate/circuit chip 100. Input/output region 100 of a larger ultrathin silicon-on-sapphire composite substrate/circuit chip is shown in FIG. 4.

The lightly shaded area 130 on the ultrathin silicon-on-sapphire composite substrate/circuit chip 100 shows the bonding position for connecting/attaching the 12×1 VCSEL array 500 to the electronic circuitry on the ultrathin silicon-on-sapphire composite substrate/circuit chip 100. Located within the lightly shaded area 130 are 12 VCSEL output areas, e.g. 131 and 132, which represent VCSEL output transmission areas where the output from a VCSEL 502 is directed into and through the ultrathin silicon-on-sapphire composite substrate/circuit chip 100 (i.e., the sapphire substrate and any transparent oxide areas). The VCSELs 502 are provided with a 12×1 array of CMOS VCSEL drivers 110 on the ultrathin silicon-on-sapphire composite substrate/circuit chip 100 where 133 represents one VCSEL driver.

CMOS VCSEL driver contacts 111,112 of the VCSEL drivers 133 are available for flip-chip bonding to the VCSELs 502 via conductive bond pads 501 on the 12×1 VCSEL array 500.

Similarly, the lightly shaded area 140 on the ultrathin silicon-on-sapphire composite substrate/circuit chip 100 shows the bonding position for connecting/attaching the 12×1 photodetector array 600 to the electronic circuitry on the ultrathin silicon-on-sapphire composite substrate/circuit chip 100. Located within the lightly shaded area 140 are 12 photodetector input areas (not shown) which represent areas where light is directed into and through the ultrathin silicon-on-sapphire composite substrate/circuit chip 100 (i.e., the sapphire substrate and any transparent oxide areas) to be received by the photodetectors 602. The photodetectors 602 are provided with a 12×1 array of transimpedance amplifiers (TIAs) 120 on the ultrathin silicon-on-sapphire composite substrate/circuit chip 100 where 134 represents one transimpedance amplifier. Transimpedance amplifier electrical contacts 121,122 for the transimpedance amplifiers 134 are available for flip-chip bonding to the photodetectors 602 via conductive bond pads 601 on the 12×1 photodetector array 600.

FIG. 5 shows a 12×1 VCSEL array 500 for connecting/ attaching over the lightly shaded area 130 in FIG. 4 of the ultrathin silicon-on-sapphire composite substrate/circuit chip 100. In this 12×1 array 500, each VCSEL 502 is provided with a conductive bond pad 501 available for bonding to a corresponding driver contact 111 on the ultrathin silicon-on-sapphire composite substrate/circuit chip 100 (see FIG. 4). Such VCSEL arrays are commercially available (Emcore Corp. MODE Division, Albuquerque, N.Mex.). In one embodiment, the VCSEL array emits radiation at 850-nm.

FIG. 6 shows a 12×1 photodetector array 600 for connecting/attaching over the lightly shaded area 140 in FIG. 4 of the ultrathin silicon-on-sapphire composite substrate/circuit chip 100. In this 12×1 array 600, each photodetector 602 is provided with a conductive bond pad 601 available for bonding to a corresponding electrical contact 122 on the ultrathin silicon-on-sapphire composite substrate/circuit chip 100 (see FIG. 4).

SUMMARY, RAMIFICATIONS AND SCOPE

The present invention provides an efficient method for combining the advantageous properties and high yields achievable with high speed silicon CMOS electronics, the advantages of an insulating substrate, and optoelectronic devices fabricated in optimal materials, without the attendant problems of delay and parasitics caused by the interconnections, through the use of composite substrates comprising silicon layers on transparent, insulating substrates such as sapphire.

The present invention also provides hybrid chips, fabricated by flip-chip bonding ultrathin silicon-on-sapphire based CMOS circuits to optoelectronic devices, combined to form an improved optical interconnection system. Such an optical interconnection system includes an array of optical inputs for delivering a plurality of optical input signals to an array of input optoelectronic devices on the hybrid chip. Logic circuitry on the chip processes electrical signals generated by the input optoelectronic devices and controls the output optoelectronic devices. The output optoelectronic devices generate a plurality of optical output signals which are delivered to an array of outputs.

By combining optical input/output functions, formed as described above, on the hybrid chips with other circuitry previously designed and optimized for ultrathin silicon-on-sapphire, it is possible to fabricate composite devices incorporating radio frequency electronic circuits, analog electronic circuits, digital electronic circuits, and optoelectronic devices all operating at high frequency without interfering with each other.

Optoelectronic applications that will advantageously employ the integrated electronic-optoelectronic devices of the present invention include free-space telecom and datacom links, interconnects for digital processing (chip-to-chip, board-to-board, computer bus etc.), high-speed spatial light modulators (SLM) for image processing and optoelectronic switching, cable TV distribution, cellular telephone infrastructure networking, light radar (LADAR), control of microwave phased-array antennas, microwave antenna remote feed and return, fiber-optic-guided missile links, tethered robotic vehicle control, etc.

To summarize, advantages that are specific to hybrid structures such as those depicted schematically in FIGS. 2A, 2B, 2C, 3B, 3C, 3D, 3E and 4 include:

Optical transparency of the sapphire substrate allows easy optical access to optoelectronic devices, for example, transmitters such as VCSELs may be top-emitting and/or bottom-emitting and receivers such as photodetectors may be frontside illuminated and/or backside illuminated;

Thermal properties of sapphire dissipate heat from the electronic and optoelectronic devices more efficiently. Good thermal diffusivity avoids hot spots;

Sapphire is very well matched to GaAs in thermal coefficient of expansion. This thermal match makes the hybrid device combination much more robust;

Good dielectric properties of sapphire reduce or eliminate substrate coupling and substrate loading effects in the electronic circuits;

Physically small size, because flip-chip bonding reduces number of individual separate device structures, which previously would have been connected by bonding wires;

Reliability is improved, since solder bonds are much less prone to failure than bond wires, whose connection to substrate is one of the most physically fragile points of an IC module;

The combination of flip-chip bonding (i.e., elimination of bonding wires and conductive vias) and fabrication in ultra-thin silicon-on-sapphire composite substrates significantly reduces electrical parasitic effects; and Cost and yield are improved, because the CMOS circuitry and the optoelectronic devices can be fabricated in arrays for bonding.

It will be understood that the method of the present invention for a integrated electronic-optoelectronic device fabricated on an ultrathin silicon-on-sapphire substrate may be employed with many dimensions and designs typical of such devices. Thus, there are numerous other embodiments of the invention which will be obvious to one skilled in the art, including but not limited to changes in the dimensions of the regions forming the devices, the type of processes used to fabricate devices, the specific circuit designs, etc. Additionally, one skilled in the art will realize that the apparatus and method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An integrated electronic-optoelectronic module comprising:

a composite substrate comprising a thin layer of silicon on a transparent, insulating substrate;

at least one electronic device fabricated in the thin layer of silicon; and at least one optoelectronic device bonded to the composite substrate and in electrical communication with at least one electronic device fabricated in the thin layer of silicon;

wherein the thin layer of silicon has been oxidized to an optically clear oxide in an area aligned with at least one optoelectronic device for transmission of radiation from or to said optoelectronic device through said optically clear oxide in said area.

2. An integrated electronic-optoelectronic module according to claim 1, wherein the at least one optoelectronic device is selected from lasers, light-emitting diodes, photodetectors, and modulators.

3. An integrated electronic-optoelectronic module according to claim 2, wherein the at least one optoelectronic device is a laser.

4. An integrated electronic-optoelectronic module according to claim 3, wherein the laser is a vertical cavity surface-emitting laser (VCSEL).

5. An integrated electronic-optoelectronic module according to claim 4, wherein the at least one electronic device comprises a CMOS electronic circuit for driving a VCSEL.

6. An integrated electronic-optoelectronic module according to claim 2, wherein the at least one optoelectronic device is a photodetector.

7. An integrated electronic-optoelectronic module according to claim 1, wherein the transparent, insulating substrate comprises sapphire.

8. An integrated electronic-optoelectronic module comprising:

an ultrathin silicon-on-sapphire composite substrate;

at least one electronic device fabricated in the ultrathin silicon; and at least one optoelectronic device bonded to the ultrathin silicon-on-sapphire composite substrate and in electrical communication with the at least one electronic device fabricated in the ultrathin silicon;

wherein the ultrathin silicon in an area aligned with said at least one optoelectronic device permits transmission of radiation from or to said optoelectronic device through said ultrathin silicon in said area.

9. An integrated electronic-optoelectronic module according to claim 8, wherein the at least one optoelectronic device is selected from lasers, light-emitting diodes, photodetectors, and modulators.

10. An integrated electronic-optoelectronic module according to claim 9, wherein the at least one optoelectronic device is a laser.

11. An integrated electronic-optoelectronic module according to claim 10, wherein the laser is a vertical cavity surface-emitting laser (VCSEL).

12. An integrated electronic-optoelectronic module according to claim 11, wherein the at least one electronic device comprises a CMOS electronic circuit for driving a VCSEL.

13. An integrated electronic-optoelectronic module according to claim 9, wherein the at least one optoelectronic device is a photodetector.

14. An integrated electronic-optoelectronic module according to claim 13, wherein the at least one electronic device comprises a CMOS amplifier for amplifying a signal from the photodetector.

15. An integrated electronic-optoelectronic module according to claim 1, wherein the at least one optoelectronic device is fabricated in a material selected from the group consisting of gallium arsenide, zinc selenide, aluminum gallium arsenide, lithium niobate, lithium tantalate, indium phosphide, and mercury cadmium telluride.

16. An integrated electronic-optoelectronic module according to claim 1, wherein the at least one optoelectronic device is fabricated in a III–V material.

17. An integrated electronic-optoelectronic module according to claim 1, wherein the at least one optoelectronic device is fabricated in a II–VI material.

18. An integrated electronic-optoelectronic module according to claim 1, wherein the at least one optoelectronic device is fabricated in an optoelectronic wafer, and the optoelectronic wafer is flip-chip bonded to the composite substrate.

19. An integrated electronic-optoelectronic module according to claim 18, wherein the optoelectronic wafer is flip-chip bonded to the composite substrate with bonding pads.

20. An integrated electronic-optoelectronic module according to claim 18, wherein the optoelectronic wafer is flip-chip bonded to the composite substrate with solder bumps.

21. An integrated electronic-optoelectronic module according to claim 8, wherein the at least one optoelectronic device is fabricated in a material selected from the group consisting of gallium arsenide, zinc selenide, aluminum gallium arsenide, lithium niobate, lithium tantalate, indium phosphide, and mercury cadmium telluride.

22. An integrated electronic-optoelectronic module according to claim 8, wherein the at least one optoelectronic device is fabricated in a III–V material.

23. An integrated electronic-optoelectronic module according to claim 8, wherein the at least one optoelectronic device is fabricated in a II–VI material.

24. An integrated electronic-optoelectronic module according to claim 8, wherein the at least one optoelectronic device is fabricated in an optoelectronic wafer, and the optoelectronic wafer is flip-chip bonded to the composite substrate.

25. An integrated electronic-optoelectronic module according to claim 24, wherein the optoelectronic wafer is flip-chip bonded to the composite substrate with bonding pads.

26. An integrated electronic-optoelectronic module according to claim 24, wherein the optoelectronic wafer is flip-chip bonded to the composite substrate with solder bumps.

* * * * *

UNITED STATES PATENT AND TRADEMARK OFFICE
CERTIFICATE OF CORRECTION

PATENT NO. : 6,583,445 B1
DATED : June 24, 2003
INVENTOR(S) : Reedy et al.

It is certified that error appears in the above-identified patent and that said Letters Patent is hereby corrected as shown below:

Column 14,
Line 56, "M. C." should read -- M.C. --.

Column 16,
Line 59, ""top:emitting"" should be -- "top-emitting" --.

Signed and Sealed this

Sixteenth Day of September, 2003

JAMES E. ROGAN
*Director of the United States Patent and Trademark Office*